United States Patent
Ogihara et al.

(10) Patent No.: US 7,202,013 B2
(45) Date of Patent: Apr. 10, 2007

(54) ANTIREFLECTIVE FILM MATERIAL, AND ANTIREFLECTIVE FILM AND PATTERN FORMATION METHOD USING THE SAME

(75) Inventors: Tsutomu Ogihara, Niigata-ken (JP); Takeshi Asano, Niigata-ken (JP); Motoaki Iwabuchi, Niigata-ken (JP); Fujio Yagihashi, Niigata-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 10/858,997

(22) Filed: Jun. 2, 2004

(65) Prior Publication Data

US 2004/0247900 A1 Dec. 9, 2004

(30) Foreign Application Priority Data

Jun. 3, 2003 (JP) .............................. 2003-157807

(51) Int. Cl.
G03C 1/73 (2006.01)

(52) U.S. Cl. ............................... 430/270.1; 430/280.1; 427/387; 528/27; 528/28; 528/29; 528/43

(58) Field of Classification Search ...................... None
See application file for complete search history.

(56) References Cited

U.S. PATENT DOCUMENTS

| | | | |
|---|---|---|---|
| 3,741,932 A | 6/1973 | Smith | |
| 4,822,687 A * | 4/1989 | Kessel et al. ................ | 428/447 |
| 5,100,503 A | 3/1992 | Allman et al. .............. | 156/643 |
| 5,294,680 A | 3/1994 | Knors et al. ............. | 525/327.4 |
| 5,324,550 A | 6/1994 | Yamaguchi et al. ........ | 427/510 |
| 5,457,003 A | 10/1995 | Tanaka et al. | |
| 5,525,457 A | 6/1996 | Nemoto et al. ............. | 430/325 |
| 5,756,255 A | 5/1998 | Sato et al. ................ | 430/270.1 |
| 5,851,730 A | 12/1998 | Thackeray et al. ...... | 430/271.1 |
| 5,851,738 A | 12/1998 | Thackeray et al. ......... | 430/327 |
| 5,908,738 A | 6/1999 | Sato et al. .................. | 430/512 |
| 6,025,117 A | 2/2000 | Nakano et al. ............. | 430/314 |
| 6,069,170 A | 5/2000 | Bringhen et al. | |
| 6,340,734 B1 | 1/2002 | Lin et al. | |
| 6,368,400 B1 | 4/2002 | Baldwin et al. | |
| 6,420,088 B1 | 7/2002 | Angelopoulos et al. .. | 430/272.1 |
| 6,515,073 B2 | 2/2003 | Sakamoto et al. .......... | 525/100 |
| 6,576,393 B1 | 6/2003 | Sugita et al. ............ | 430/270.1 |
| 6,730,453 B2 | 5/2004 | Nakashima et al. | |
| 7,060,414 B2 | 6/2006 | Suzuki et al. | |
| 2003/0198877 A1 * | 10/2003 | Pfeiffer et al. ................ | 430/15 |
| 2003/0209515 A1 | 11/2003 | Pavelchek ..................... | 216/16 |
| 2004/0146802 A1 | 7/2004 | Yamamoto et al. | |
| 2004/0191479 A1 * | 9/2004 | Hatakeyama et al. ....... | 428/141 |
| 2004/0241580 A1 | 12/2004 | Nishimura et al. | |

FOREIGN PATENT DOCUMENTS

| | | |
|---|---|---|
| JP | 56129261 A | 10/1981 |
| JP | 57083563 A | 5/1982 |
| JP | 57131250 A | 8/1982 |
| JP | 63138353 A | 6/1988 |
| JP | 6138664 A | 5/1994 |
| JP | 8027420 A | 1/1996 |
| JP | 8179509 A | 7/1996 |
| JP | 10069072 A | 3/1998 |
| JP | 2001022082 A | 1/2001 |
| JP | 2001022083 A | 1/2001 |
| JP | 2001092122 A | 4/2001 |
| WO | WO0077575 A1 | 6/2000 |

OTHER PUBLICATIONS

"Characteristics of a Chemically-Amplified Silicone Based Negative Resist (CSNR) in Electron Beam Lithography" authored by Tanaka et al. and published in the Japanese Journal of Applied Physics, Part 1: Regular Papers, Short Notes and Review Papers (1992), 31(7), pp. 2277-2281.*

Kim et al. "Investigation of Hardmask/BARC Materials for 157nm Lithography", SPIE 4226:93-106 (2000).

Lin et al. "A High Resolution 248nm Bilayer Resist", SPIE 3678:241-250 (1999).

Lynch et al. "Properties and Performance of Near UV Reflectivity Control Layers", SPIE 2195:225-229 (1994).

Trefonas et al. "Organic Antireflective Coatings for 193nm Lithography", SPIE 3678:702-712 (1999).

* cited by examiner

Primary Examiner—Marc S. Zimmer
(74) Attorney, Agent, or Firm—Myers Bigel Sibley & Sajovec, PA

(57) ABSTRACT

It is an object of the present invention to provide a material for an antireflective film that has high etching selectivity with respect to the resist, that is, that has a faster etching speed than the resist, a pattern formation method for forming an antireflective film layer on a substrate using this antireflective film material, and a pattern formation method using this antireflective film as a hard mask for substrate processing.

The present invention provides an antireflective film material comprising a polymer (A) comprising copolymerized repeating units expressed by the Formula (1) and/or the Formula (2), an organic solvent (B), an acid generator (C) and an optional crosslinking agent (D)

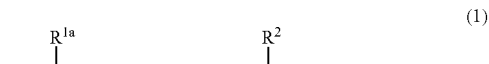
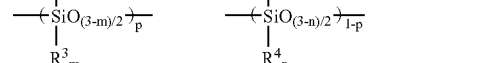
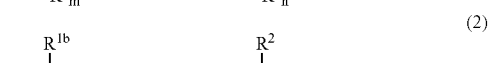
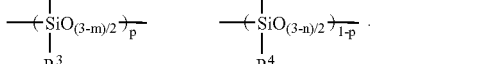

5 Claims, 3 Drawing Sheets

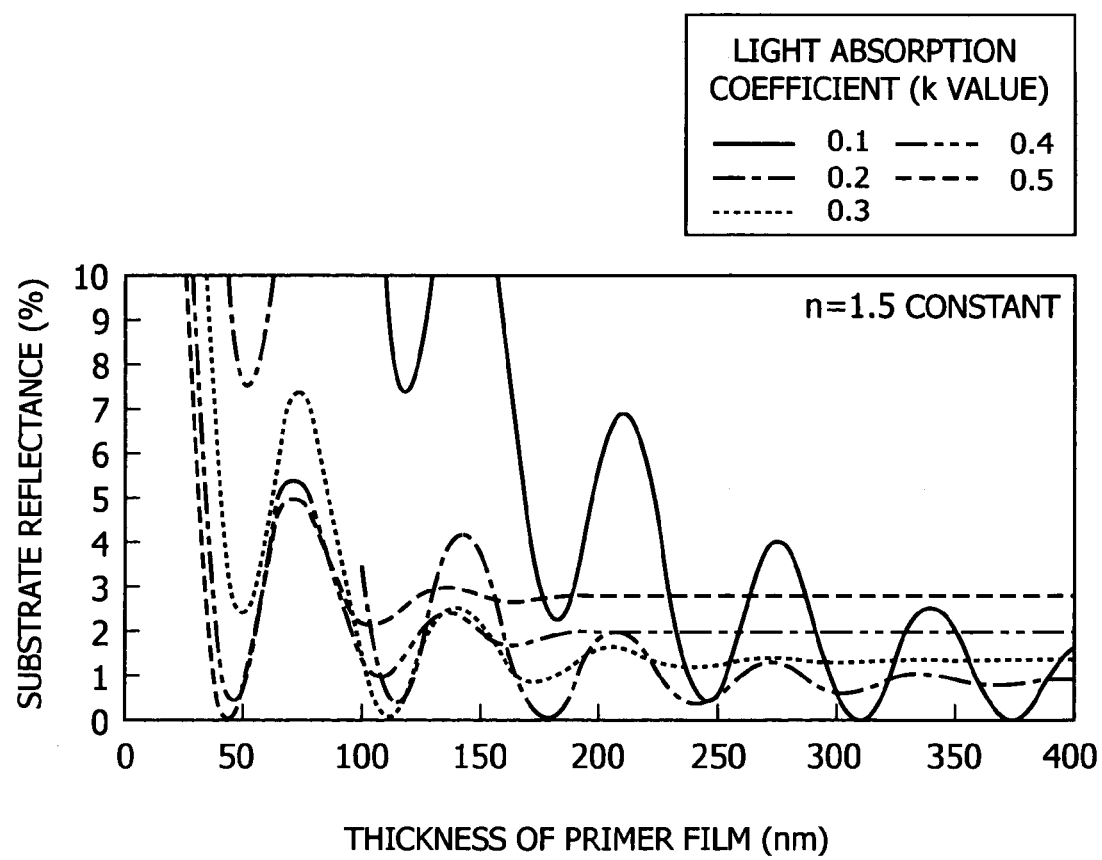

ANTIREFLECTIVE FILM MATERIAL, AND ANTIREFLECTIVE FILM AND PATTERN FORMATION METHOD USING THE SAME

CROSS-REFERENCE TO RELATED APPLICATION

The present application claims priority to Japanese Patent Application No. 2003-157807, filed Jun. 3, 2003, the disclosure of which is incorporated herein by reference in its entirely.

BACKGROUND OF THE INVENTION

1. Field of the Invention

The present invention relates to an antireflective film material whose primary component is a compound comprising a substitution group that comprises a silicon atom and which is suitable for fine processing in the manufacturing of semiconductor elements or the like; a resist pattern formation method which employs the antireflective film material and which is suited for exposure by far ultraviolet radiation, ArF excimer laser light (193 nm), $F_2$ laser light (157 nm), $Kr_2$ laser light (146 nm) and $Ar_2$ laser light (126 nm); and a method for forming an integrated circuit pattern on substrates.

2. Description of the Related Art

In recent years, as the increased integration and higher speeds of LSIs have resulted in a need for pattern rules to be made even finer, the limit to the fundamental resolution inherent in the wavelength of the light source in lithography using light exposure, which at present is adopted as the standard technology, is approaching.

There is wide use of light exposure in which the g-line (436 nm) or the i-line (365 nm) of a mercury lamp is employed as a light source in lithography, which is used when forming resist patterns, and one effective means to achieve even greater fineness has been to shorten the wavelength of the exposure light. Short wavelength KrF excimer laser light (248 nm) has therefore come to be used in place of the i-line (365 nm) as the exposure light source in the mass production process of 64 Mbit DRAM processing methods. However, a light source with an even shorter wavelength is required to manufacture DRAMs with a degree of integration greater than 1 G, which requires even finer processing technologies (processing dimensions of 0.13 μm or less), and as such, lithography employing ArF excimer lasers (193 nm) in particular has been investigated.

In the initial stages of KrF lithography a stepper was developed by combining an achromatic lens or a reflective optical system, for example, with a broadband light. However, because the precision of achromatic lenses or aspherical reflective optical systems was not adequate, the combination of narrow-band laser light and a refractive optical system became mainstream. It has been well documented that in single wavelength exposure, typically there is interference between incident light and light reflected by the substrate, and this generates a stationary wave. It is also known that the problem known as halation occurs as a result of light being focused or dispersed due to level differences in the substrate. Stationary waves and halation both cause dimensional fluctuations in the line width of the pattern, for instance, or result in collapse of the shape, for example. The use of coherent monochromatic light allows the wavelength to be shortened but also further amplifies stationary waves and halation. Thus, providing a light-absorbing agent in the resist or applying an antireflective film on the resist surface or on the substrate surface were proposed as methods for inhibiting halation and stationary waves. However, the method of inserting a light-absorbing agent resulted in the problem that the resist pattern shape became tapered. The problem of stationary waves and halation effecting fluctuations in pattern dimensions has become worse in conjunction with the shortening of wavelengths and the progress in providing greater fineness in recent years, and this could not be remedied with the method of inserting a light-absorbing agent.

An upper-layer transmission-type antireflective film in principle is effective only in reducing stationary waves, and is not effective for halation. Further, the refractive index of an upper-layer antireflective film that completely cancels out stationary waves is ideally the square root of the refractive index of the resist, and thus with the 1.8 refractive index of polyhydroxystyrene-based resist, which is used with KrF, this refractive index is ideally 1.34. In the case of the 1.6 refractive index of alicyclic acrylic resist, which is used with ArF, this refractive index is ideally 1.27. Perfluoro-based materials are the only materials having such low refractive indices, and since in terms of processing it is advantageous that the upper-layer antireflective film can be stripped away during alkali developing, it is necessary that the material is water-soluble. When a hydrophilic substitution group is introduced in order to make perfluoro-based material, which is extremely hydrophobic, water-soluble, the refractive index increases, becoming a value of about 1.42 in the case of KrF and about 1.5 in the case of ArF. Thus, if patterning at 0.20 μm or less with KrF lithography, then with the combination of a light-absorbing agent and the upper-layer antireflective film alone it is not possible to suppress the effects of stationary waves. In the case of ArF, the effects of the upper-layer antireflective film can be expected to be almost negligible due to the reasons mentioned above, and even in the case of KrF, once it has become difficult to manage the line width due to further future reductions in the line width, it will be necessary to provide an antireflective film on the primer of the resist.

If there is a highly reflective substrate such as polysilicon or aluminum below the antireflective film of the primer of the resist, then setting a material with an ideal refractive index (n value) and light absorption coefficient (k value) to a suitable film thickness can achieve a very large effect, allowing reflection from the substrate to be reduced to 1% or less. For example, with a wavelength of 193 nm and a 1.8 refractive index of the resist, the reflectance is 0.5% or less (see FIG. 3) if the lower-layer antireflective film has a refractive index (real refractive index) of n=1.5, an absorption coefficient (imaginary refractive index) of k=0.5, and a film thickness of 42 nm. However, if there is a step in the primer, then there is significant fluctuation in the thickness of the antireflective film above that step. Since the antireflective effect of the primer is due not only to the absorption of light but also to utilization of the interference effect, the first base of 40 to 45 nm, which has a strong interference effect, has an accordingly high antireflective effect, but the reflectance fluctuates significantly due to fluctuation in the film thickness. A material in which the molecular weight of the base resin employed in the antireflective film material is raised to inhibit fluctuations in the film thickness above steps and increase the conformal properties has been proposed (Japanese Patent Application Unexamined Publication No. 10-069072/1998), but when the molecular weight of the base resin is high there are the problems that pin holes easily form after spin coating, filtration is no longer possible, temporary fluctuations in the viscosity that change the film thickness occur, and crystalline objects settle at the tip of the nozzle. Furthermore, the conformal properties can be exhibited only when the step is relatively low.

A further conceivable method is to adopt the film thickness of the third base or higher (170 nm of higher), in which fluctuations in the reflectance due to fluctuations in the film thickness are comparatively small. In this case, if the film thickness is 170 nm or more and the k value is between 0.2 and 0.3, then there is little fluctuation in the reflectance in response to changes in the film thickness, and moreover, the reflectance can be kept at or below 1.5%. If the primer of the antireflective film is a transparent film such as an oxide film or a nitride film and there is a step below that transparent film, then the thickness of the transparent film fluctuates even if the surface of the transparent film is leveled by CMP (Chemical Mechanical Polishing) or the like. In this case, it is possible to keep the thickness of the antireflective film above the transparent film constant, but when the film thickness of the transparent film primer below the antireflective film fluctuates, the minimum reflective film thickness in FIG. 3 is shifted by the film thickness of the transparent film at a period of $\lambda/2n$ ($\lambda$: exposure light wavelength, n: refractive index of the transparent film at the exposure light wavelength). If the film thickness of the antireflective film is set to the minimum reflective film thickness of 55 nm when the primer is a reflective film, then portions with a high reflectance emerge due to fluctuations in the film thickness of the transparent film. In this case, it is necessary to set the film thickness of the antireflective film to 170 nm or more as discussed above in order to stabilize the reflectance with respect to changes in the film thickness of the primer transparent film as well.

The materials for the antireflective film can be broadly divided into inorganic and organic materials. A SiON film is an example of an inorganic material. This film is formed by CVD employing a mixture gas of silane and ammonia, for example, and has the advantage that the burden of etching on the resist is small because it has a large etching selection ratio with respect to the resist, but because the film is not easily stripped away there is a limit as to when it can be employed.

Since the substrate is a basic substrate that comprises nitrogen atoms, there is the shortcoming that footing results easily with a positive resist and an undercut profile results easily with a negative resist. Organic materials are advantageous in that they can be spin coated and thus do not require special devices for CVD or sputtering, for example, they can be stripped away at the same time as the resist, and they have a straightforward shape in which tailing or the like does not occur and have good adherence with respect to the resist. Thus, many antireflective films with an organic material base have been proposed. For example, there is the condensate of a diphenylamine derivative and a formaldehyde-modified melamine resin, and a material made of an alkali-soluble resin and a light-absorbing agent, set forth in Japanese Patent Application Examined Publication No. 7-069611/1995, the reaction product of anhydrous maleate copolymer and a diamine light-absorbing agent set forth in U.S. Pat. No. 5,294,680, the material containing a resin binder and a methylol melamine-based thermal crosslinking agent set forth in Japanese Patent Application Unexamined Publication No. 6-118631/1994, the acrylic resin base containing a carboxylic acid group, an epoxy group, and a light-absorbing group within the same molecule set forth in Japanese Patent Application Unexamined Publication No. 6-118656/1994, the material made of methylol melamine and a benzophenone-based light-absorbing agent set forth in Japanese Patent Application Unexamined Publication No. 8-87115/1996, and the material obtained by adding a low molecular weight light-absorbing agent to a polyvinyl alcohol resin set forth in Japanese Patent Application Unexamined Publication No. 8-179509/1996. For all of these materials, a method of adding a light-absorbing agent to a binder polymer or introducing a light-absorbing agent to a polymer as a substitution group is employed. However, since many light-absorbing agents have aromatic groups or double bonds, there is the shortcoming that adding a light-absorbing agent increases the dry etching resistance and that the dry etching selection ratio with respect to the resist is not particularly high. Fine processing techniques are becoming more advanced and there is a drive to make even resist films thinner, and moreover, in next-generation ArF exposure, acrylic or alicyclic polymers will come to be employed as the resist material, and this will result in a drop in the etching resistance of the resist. Moreover, as mentioned above, there is also the problem that the film thickness of the antireflective film must be made thick. Etching is therefore a crucial issue, and there is a demand for antireflective films with a high etching selection ratio with respect to the resist, that is, with a fast etching speed.

Light-absorbing agents for giving an ideal light-absorption coefficient in antireflective films are under investigation. Anthracene light-absorbing agents in particular have been proposed for KrF, and phenol light-absorbing agents have been proposed for ArF. These, however, are also substitution groups having excellent dry etching resistance, as mentioned above, and there is a practical limit as to their use if a polymer backbone with pendant dye is used as a polymer with low etching resistance, such as acrylic. On the other hand, in general, materials comprising silicon are known to have a fast etching speed and to yield a high selection ratio with respect to the resist under etching conditions in which a fluorocarbon-based gas is used, and thus it is conceivable that the etching selection ratio can be significantly increased by using an antireflective film that comprises silicon atoms. For example, an antireflective film for KrF exposure having a backbone of polysilane with a pendant phenyl group is proposed in Japanese Patent Application Unexamined Publication No. 11-060735/1999, and achieves a high etching selection ratio.

Progress has been made in providing thinner resist films as higher resolutions have been achieved in recent years. The decrease in film thickness has been accompanied by a need to increase the etching resistance of the resist, but this alone is not sufficient. The use of a hard mask is one method for transferring the pattern of a thin film resist. Using a $SiO_2$ film when the substrate to be processed is p-Si, for example, and using SiN, W—Si, and amorphous Si, for example, when the substrate to be processed is a $SiO_2$ film, has been investigated. There are cases in which the hard mask remains and cases in which it is stripped away, and particularly in a case where the primer is an insulating film such as a $SiO_2$ film, W—Si and amorphous Si films are particularly good conductor films, and thus stripping is necessary. A SiN film is an insulating film and thus stripping may not be necessary depending on the circumstances, but since the film is constituted by elements similar to those of $SiO_2$, there is the shortcoming that the etching selection ratio, which is one of the essential functions of hard masks, is low. A SiON film hard mask that also functions as an antireflective film has also been proposed (SPIE 2000, Vol. 4226, p93).

Here, application solutions for forming silica-based insulating films are proposed in Japanese Patent Application Unexamined Publication Nos. 57-083563/1982, 57-131250/

1982, 56-129261/1981, 2001-022082 and 2001-022083 and Japanese Patent No. 3,287,119. Using these technologies, many pattern formation methods using a silicon-containing polymer as the lower layer film of the resist have been proposed. For example, Japanese Patent No. 3,118,887 and Japanese Patent Application Unexamined Publication No. 2000-356854 propose a three-layer process in which an organic film is formed on a substrate, silica glass is spin coated onto that film, the resist pattern thereon is transferred to the silica glass layer, the pattern next is transferred to the organic film layer by oxygen gas etching, and lastly, the substrate is processed. Japanese Patent Application Unexamined Publication Nos. 5-027444/1993, 6-138664/1994, 2001-053068, 2001-092122 and 2001-343752 propose silica glass layers and silsesquioxane polymer materials that also function as antireflective films. Furthermore, U.S. Pat. No. 6,420,088 and Japanese Patent Application Unexamined Publication (Tokuhyo) No. 2003-502449 propose materials which function as both a reflecting film whose base is a silsesquioxane polymer, or a spin-on-glass material, respectively, and as a hard mask. However, in each of these silicon-containing polymers there was a problem with preservation stability, and there was the critical flaw that the film thickness fluctuates when the polymers are put into practical use.

SUMMARY OF THE INVENTION

The issues to be solved by the present invention are to provide a material for an antireflective film in which the etching selection ratio with respect to the resist is high, that is, which has a fast etching speed when compared to the resist, and in which there is little fluctuation in film thickness over prolonged periods of storage, a pattern formation method for forming an antireflective film layer on a substrate using this antireflective film material, and a pattern formation method that uses this antireflective film as a hard mask for processing the substrate.

One of the characteristics demanded of an antireflective film is the absence of intermixing with the resist and the absence of diffusion of low-molecular components to the resist layer (Proc. SPIE Vol. 2195, 225–229 (1994)). Thermal crosslinking by baking after spin coating the antireflective film may typically be employed as the method for preventing the above. Moreover, it is desirable that the antireflective film or the resist pattern on the resist undercoat layer is vertical in shape without tailing or undercutting. This is because in the presence of tailing, dimensional conversion differences occur after etching the antireflective film, whereas in the presence of undercutting, toppling of the resist pattern occurs after developing.

The reference, Proc. SPIE Vol. 3678, 241–250 (1999), reports that crosslinking through acid is effective in reducing tailing in positive-type resists. The method of adding a crosslinking agent and carrying out crosslinking through acid is crucial in antireflective film materials, and in Japanese Patent Application Unexamined Publication Nos. 2001-092122 and 5-027444/1993 the addition of a crosslinking agent is regarded as effective.

Here there is the problem that the cross-sectional pattern of the resist after developing becomes a reverse tapered shape. It is conceivable that the reason for this is that the acid that is used in the crosslinking reaction of the antireflective film moves to the resist layer and eliminates the acid labile group of the resist during baking or neutralizes amine compounds that have been added to the resist. One possible method for keeping acid from moving into the resist layer is to make the acid that is generated in the antireflective film bulky, but this makes it difficult for the crosslinking reaction to proceed and becomes a cause of intermixing with the resist, and thus is not preferable. Here, SPIE Vol. 3678, p702 (1999) proposes a material that employs a three-component copolymer of hydroxyethylmethacrylate, methylacrylate, and styrene as the organic antireflective film for ArF. Hydroxyethylmethacrylate and a glycoluril-based crosslinking agent are used as the crosslinking system.

Here it is important to recognize that methacrylate is present, and that by copolymerizing methacrylate, reverse tapering is prevented. It is thought that methacrylate also has the effect of increasing adsorption with the resist and inhibiting acid diffusion. To prevent a reverse tapered shape it is necessary to trap the acid in the antireflective film after crosslinking, and to do this it is effective to use a polymer that comprises carbonyl, ester, lactone or ether groups, and we came upon the idea of using a siloxane polymer resin with a pendant functional group as the antireflective film.

The present invention provides an antireflective film material comprising a polymer (A) comprising copolymerized repeating units expressed by Formula (1) and/or Formula (2) below, an organic solvent (B), an acid generator (C), and a crosslinking agent (D).

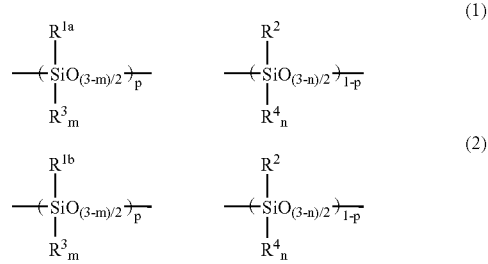

wherein $R^{1a}$ is a monovalent organic group which is capable of reacting with a crosslinking agent; $R^2$ is a monovalent organic group containing a light-absorbing group; p is a number in the range $0<p<1$; $R^3$ is a hydroxyl group, an alkyl group having 1 to 6 carbon atoms, an alkoxy group having 1 to 4 carbon atoms, or has the same definition as that of $R^2$; $R^4$ has the same definition as that of $R^{1a}$ or $R^3$; m is a number in the range $0 \leq m \leq 1$; and n is a number in the range $0 \leq n \leq 1$; $R^{1b}$ is a monovalent organic group which is obtainable by modifying $R^{1a}$ and which is capable of reacting with a crosslinking agent.

The present invention also provides a pattern formation method for forming a pattern on a substrate through lithography, comprising at least steps of applying an antireflective film material onto a substrate; baking the applied antireflective film material to form an antireflective film; applying a photoresist film material onto the antireflective film; prebaking the applied photoresist film material to form a photoresist film; exposing a pattern circuit region of the photoresist film to light; and then developing it with a developing liquid to form a resist pattern in the photoresist film; and etching the antireflective film and the substrate with the photoresist film serving as a mask, where the resist pattern has been formed in the photoresist film, so as to form the resist pattern on the substrate.

In another preferable embodiment of forming a pattern on a substrate through lithography, the present invention also provides a pattern formation method comprising at least steps of applying an antireflective film material onto a substrate; baking the applied antireflective film material to form an antireflective film; applying a photoresist film material onto the antireflective film; and prebaking the applied photoresist film material to form a photoresist film; exposing a pattern circuit region of the photoresist film to light; and then developing it with a developing liquid to form a resist pattern in the photoresist film; etching the antireflective film with the photoresist film serving as a mask, where the resist pattern has been formed in the photoresist film; and further etching the substrate with the antireflective film serving as a mask, where the pattern has been formed in the antireflective film, so as to form a pattern on the substrate.

In another preferable embodiment of forming a pattern on a substrate through lithography, the present invention also provides a pattern formation method comprising at least steps of forming an organic film on a substrate; applying an antireflective film material onto the organic film; baking the applied antireflective film material to form an antireflective film; applying a photoresist film material onto the antireflective film; prebaking the photoresist film material to form a photoresist film; exposing a pattern circuit region of the photoresist film to light; and then developing it with a developing liquid to form a resist pattern in the photoresist film; etching the antireflective film with the photoresist film serving as a mask, where the resist pattern has been formed in the photoresist film; etching the organic film with the antireflective film serving as a mask, where the pattern has been formed in the antireflective film; and etching the substrate so as to form a pattern on the substrate.

It should be noted that exposure may be preferably performed using high energy radiation at a wavelength of 300 nm or less or an electron beam.

The present invention also provides an antireflective film obtainable by applying an antireflective film material of the present invention onto a substrate and baking the antireflective film material.

According to the antireflective film material of the present invention, it is possible to obtain an antireflective film, in particular, having an n value and a k value with which a sufficient antireflective effect can be attained with respect to exposure at short wavelengths, and having the high etching selection ratio, wherein the etching speed is sufficiently faster than that of the photoresist film and the etching speed is sufficiently slower than that of the substrate to be processed. With the antireflective film material of the present invention there is little fluctuation in film thickness even if stored for prolonged periods. Consequently, this antireflective film is highly effective as a hard mask for the substrate to be processed. Moreover, the resist pattern that is formed in the photoresist film on the antireflective film can be in a vertical shape in which reverse tapering, tailing or the like does not occur.

BRIEF DESCRIPTION OF THE DRAWINGS

FIG. 3 is a graph showing the relationship between the film thickness and the reflectance of the antireflective film, and indicates the substrate reflectance with respect to various k values.

DETAILED DESCRIPTION OF THE PREFERRED EMBODIMENTS

Figure 1:
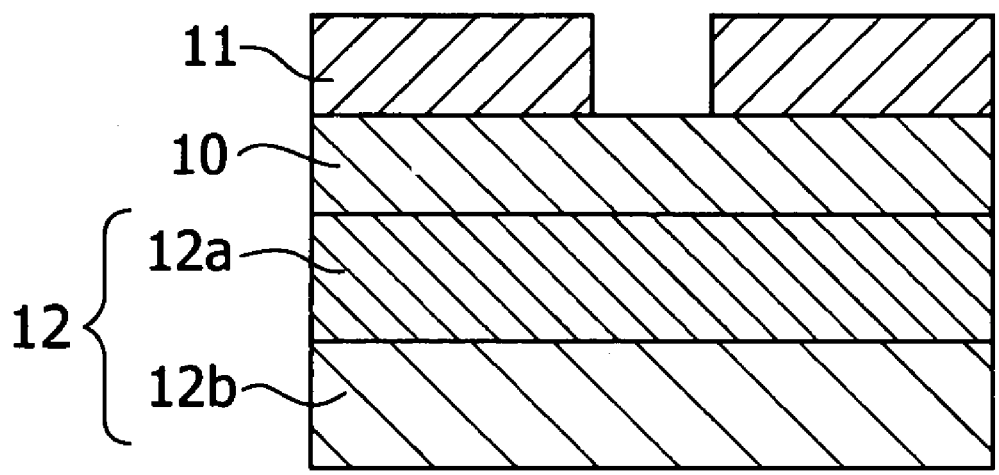
FIG. 1 is a diagram related to the pattern formation method of the present invention and shows the resist pattern (a) after developing and the pattern (b) after dry-etching the substrate.
Figure 1:
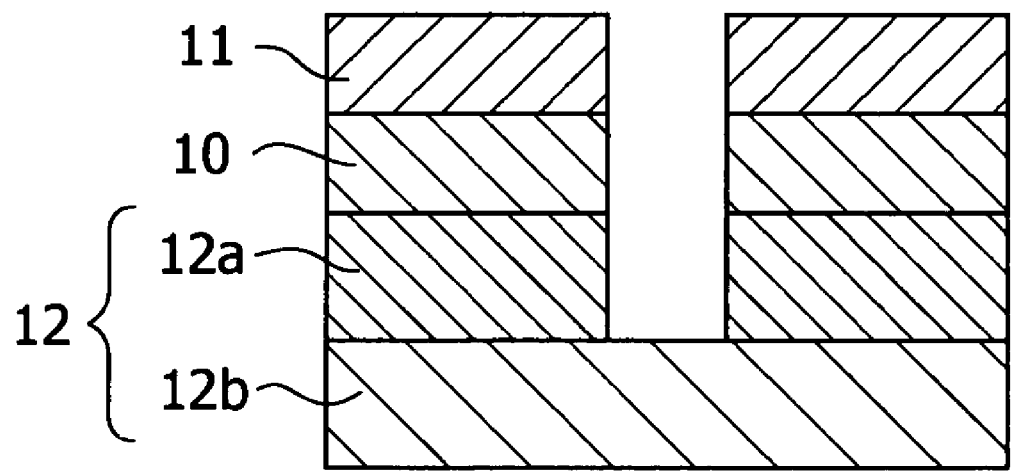

The present invention is described in further detail below.

To obtain the polymer shown in Formula (1) of the present invention, it may be preferable that the silicon-containing compound shown in the formula below is used.

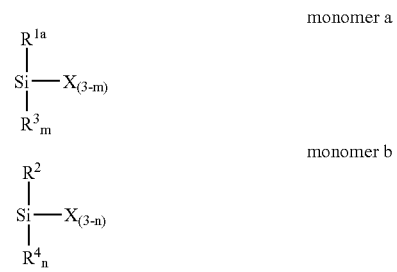

Herein, $R^{1a}$ is a monovalent organic group that can react with a crosslinking agent (discussed later), and may comprise, for example, a hydroxyl group, ester group or epoxy group, preferably an epoxy group, so that it can react with a crosslinking agent. The organic group is a substitution group that comprises carbon. The preferable monovalent organic group serving as $R^{1a}$ may be an organic group in which one or more hydrogen atoms of the straight, branched or cyclic alkyl group having 1 to 20 carbon atoms have been substituted by a hydroxyl group, an organic group esterified by carboxylic acid having not more than 4 carbon atoms, or an organic group of the repeating unit illustrated in the example discussed later of a "preferable repeating unit in Formula (1) that corresponds to the mole fraction p and that has a reactive group."

$R^2$ is a monovalent organic group that has a light-absorbing group, absorbs light at a wavelength between 150 to 300 nm, and may preferably have an anthracene ring, a naphthalene ring, a benzene ring or one of these rings having one or more substitution groups. The substitution group(s) may include preferably an alkoxy, acyloxy or acetal group having 1 to 6 carbons, more preferably a methoxy, t-butoxy, t-amyloxy, acetoxy or 1-ethoxyethoxy group as shown in the example discussed later of a "preferable repeating unit that corresponds to a mole fraction (1-p) and that has a light-absorbing group."

$R^3$ is a hydroxyl group, an alkyl group having 1 to 6 carbon atoms, an alkoxy group having 1 to 4 carbon atoms, or has the same definition as that of $R^2$.

$R^4$ has the same definition as that of $R^{1a}$ or $R^3$.

X denotes a halogen atom, a hydroxyl group or an alkoxy group having 1 to 6 carbon atoms. If plural Xs are present, the denotations of Xs may be same or different. If m and n are 0, then the polymer after polymerization is a silsesquioxane and has a silicon ladder structure. If m and n are 1, then the polymer is a straight-chain silicone polymer. In all other instances the polymer is a copolymer of these. The polymer can also be a copolymer using two or more types of monomer a or two or more types of monomer b.

Preferably, the weight-average molecular weight of the polymer expressed by Formula (1) may be 1,000 to 1,000, 000, more preferably 1,500 to 500,000, measured with GPC (gel permeation chromatography) using a polystyrene standard.

Examples of the preferable repeating unit in Formula (1) that corresponds to the mole fraction p and that has a reactive organic group are shown below.

Next, examples of the preferable repeating unit in Formula (1) that corresponds to a mole fraction (1-p) and that has a light-absorbing group are shown below.

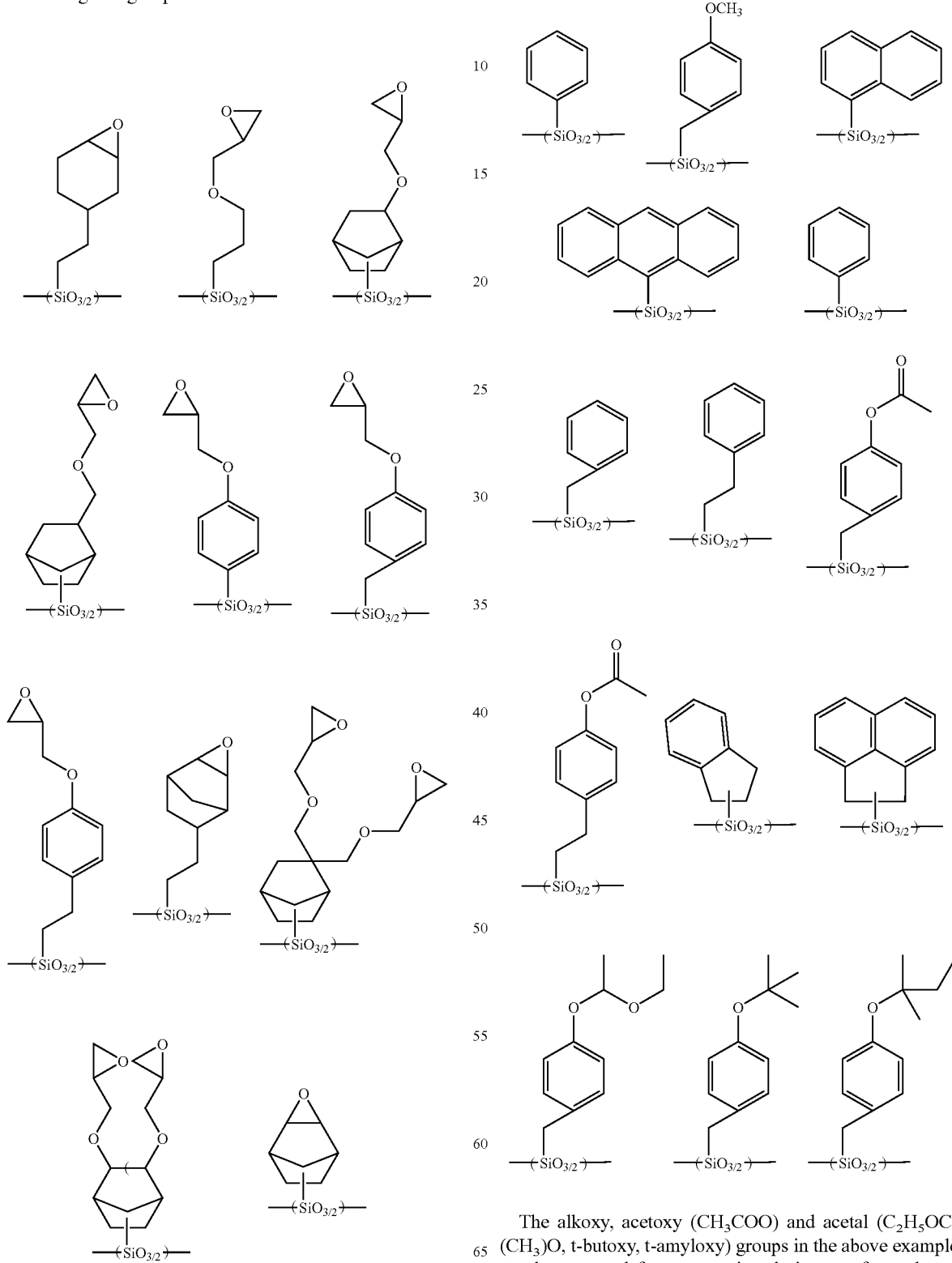

The alkoxy, acetoxy ($CH_3COO$) and acetal ($C_2H_5OCH(CH_3)O$, t-butoxy, t-amyloxy) groups in the above examples can be removed from protection during or after polymerization and converted into a hydroxyl group.

In addition to aromatic absorption groups, it is also possible to use an absorption group having a Si—Si bond. Examples thereof may include the followings:

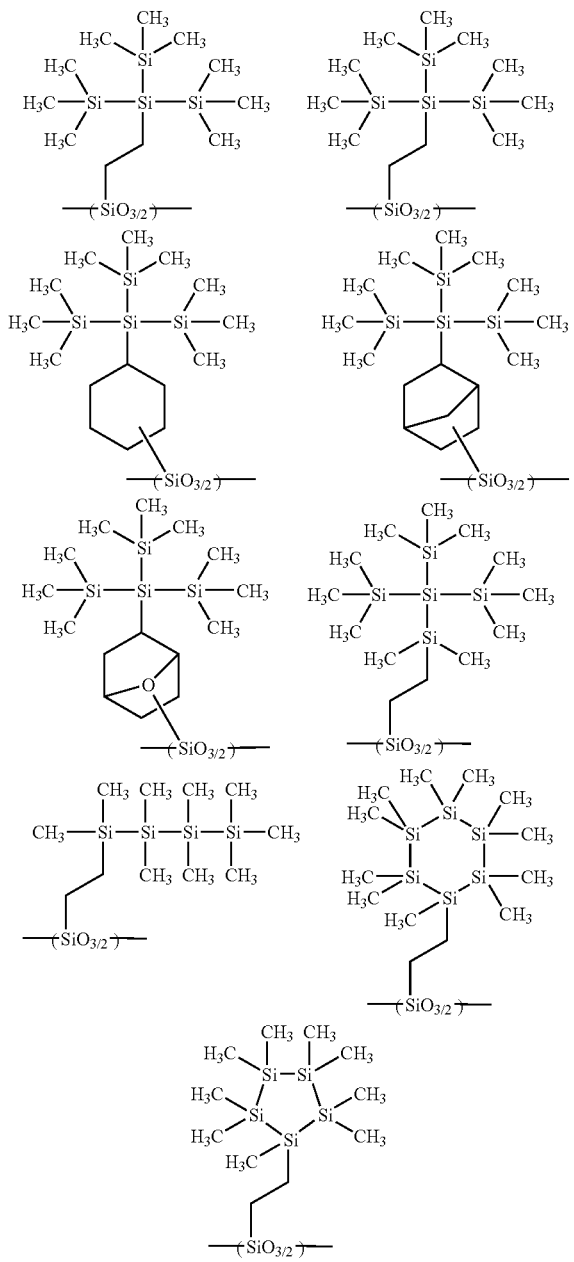

As the method for synthesizing the above polymers, hydrolysis and cocondensation of the monomers expressed by formulas a and b above may be performed. Regarding the amount of water in the hydrolysis reaction, it may be preferable that 0.2 to 10 moles of water per one mole of monomer is added. At this time it may be possible to use a catalyst, examples of which include acids such as acetic acid, proprionic acid, oleic acid, stearic acid, linoleic acid, salicylic acid, benzoic acid, formic acid, malonic acid, phthalic acid, fumaric acid, citric acid, tartaric acid, hydrochloric acid, sulfuric acid, nitric acid, sulfonic acid, methylsulfonic acid, p-toluenesulfonic acid (tosic acid) and trifluoromethane sulfonic acid; bases such as ammonia, sodium hydroxide, potassium hydroxide, barium hydroxide, calcium hydroxide, trimethylamine, triethylamine, triethanolamine, tetramethylammonium hydroxide, choline hydroxide and tetrabutylammonium hydroxide; and metal chelate compounds such as titanium tetraalkoxide, trialkoxymono (acetylacetonato)titanium, zirconium tetraalkoxide, and trialkoxymono(acetylacetonato)zirconium. Preferably an organic amine may be used in order to keep the epoxy ring from opening during polymerization and to keep impurities such as alkali and metals from mixing in.

As for the reaction operation, the monomers may be dissolved in an organic solvent and water may be added to start the hydrolysis reaction. The catalyst can be added to the water or it can be added to the organic solvent. The reaction temperature may be from 0 to 100° C., preferably from 10 to 80° C. It may be preferable that the solution is heated to 10 to 50° C. while water is added in a dropwise manner and then the temperature is raised to 40 to 80° C. for maturation. The organic solvent may be preferably slightly soluble or insoluble in water, and may preferably include tetrahydrofuran, toluene, hexane, ethyl acetate, cyclohexanone, methyl-2-n-amylketone, propyleneglycol monomethyl ether, ethyleneglycol monomethyl ether, propyleneglycol monomethyl ether, ethyleneglycol monoethyl ether, propyleneglycol dimethyl ether, diethyleneglycol dimethyl ether, propyleneglycol monomethyl ether acetate, propyleneglycol monoethyl ether acetate, ethyl pyruvate, butyl acetate, methyl 3-methoxypropionate, ethyl 3-ethoxypropionate, tert-butyl acetate, tert-butyl propionate, propyleneglycol monotert-butyl ether acetate, γ-butyllactone and mixtures thereof.

The catalyst may be then neutralized, and the organic solvent phase may be separated and dried. It has to be dried sufficiently because the residual water promotes condensation of the remaining silanol. The preferable drying method may include adsorption with a salt such as magnesium sulfate or with a molecular sieve, and azeotropic dehydration while removing the solvent.

As a separate operation method, it may be also possible to dissolve the water and the catalyst in the organic solvent and then add the monomers thereto. At this time, the monomers can have been diluted with the organic solvent. The reaction temperature may be from 0 to 100° C., preferably from 10 to 80° C. It may be preferable that the solution is heated to 10 to 50° C. while adding the water in a dropwise manner and then the temperature is raised to 40 to 80° C. for maturation. The organic solvent may preferably be water-soluble and may preferably include methanol, ethanol, 1-propanol, 2-propanol, 1-butanol, 2-butanol, 2-methyl-1-propanal, acetone, tetrahydrofuran, acetonitrile, propyleneglycol monomethyl ether, ethyleneglycol monomethyl ether, propyleneglycol monomethyl ether, ethyleneglycol monoethyl ether, propyleneglycol dimethyl ether, diethyleneglycol dimethyl ether, propyleneglycol monomethyl ether acetate, propyleneglycol monoethyl ether acetate, propyleneglycol monopropyl ether and mixtures thereof.

Later, a slightly soluble or insoluble organic solvent may be added to the above solution, and the organic solvent phase is separated and washed with water to remove the catalyst used in the hydrolysis and condensation. The catalyst can be neutralized at this time if necessary. The separated organic solvent phase may be then dehydrated. The dehydration has to be carried out sufficiently because the residual water promotes condensation of the remaining silanol. The preferable dehydration method may include adsorption with a salt such as magnesium sulfate or with a molecular sieve, and azeotropic dehydration while removing the solvent.

The polymer (1) containing a reactive organic group can be converted into the polymer (2) by performing a further modification reaction. The preferable weight-average molecular weight of the polymer expressed by Formula (2) may be the same as that of the polymer expressed by Formula (1).

$R^{1b}$ in Formula (2) may preferably comprise carbon-oxygen single bonds and/or carbon-oxygen double bonds, alkylcarbonyloxyacetoxy, alkoxy, or methoxy groups, and may preferably have 2 to 40 carbon atoms, more preferably 5 to 25 carbon atoms.

Examples of the repeating unit in Formula (2) that corresponds to the mole fraction p and that has a crosslinking organic group are shown below.

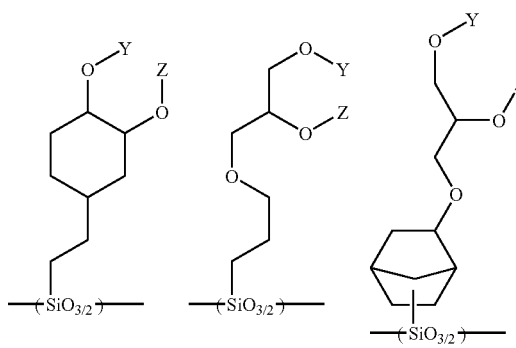

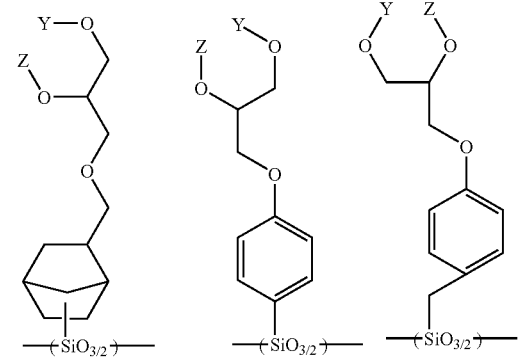

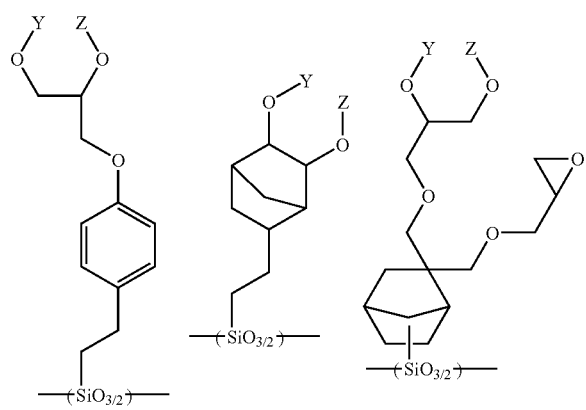

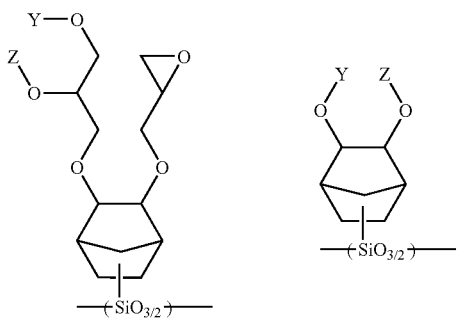

-continued

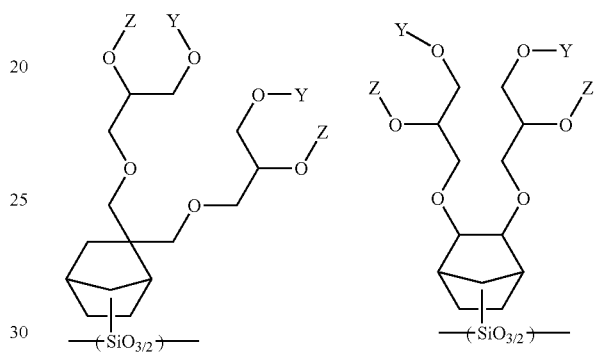

Here, Y and Z each independently represents a hydrogen atom, an alkyl group having 1 to 6 carbons, an alkylcarbonyl group having 1 to 8 carbons, or an alkoxycarbonyl group having 1 to 6 carbon atoms, and specific examples thereof may include methyl, ethyl, n-propyl, i-propyl, n-butyl, i-butyl, sec-butyl, t-butyl, n-pentyl, 2-methylbutyl, 3-methylbutyl, 2,2-dimethylpropyl, cyclopental, n-hexyl, cyclohexyl, formyl, acetyl, propionyl, butyryl, isobutyryl, valeryl, isovaleryl, pivaloyl, cyclohexylcarbonyl, methoxycarbonyl, ethoxycarbonyl, propoxycarbonyl, butoxycarbonyl and t-butoxycarbonyl groups.

Commonly known methods can be employed to effect the conversion from the polymer (1) to the polymer (2). For example, by heating the polymer (1) together with an alcohol or a carboxylic acid in the presence of an acid, alkali or quaternary ammonium catalyst, it can be easily converted into the polymer (2). Further, in a reaction with a carboxylic acid, the carboxylic acid itself serves as a catalyst, and thus it is not necessary to add a catalyst. Even if the polymer (1) is an ester compound, conversion to the corresponding hydroxyl groups is possible under the same reaction conditions.

Examples of suitable acid catalyst used at this time may include hydrochloric acid, nitric acid, sulfuric acid, phosphoric acid, perchloric acid, methanesulfonic acid, benzenesulfonic acid, toluenesulfonic acid, trifluoroacetic acid, trifluoromethanesulfonic acid, oxalic acid, acetic acid, proprionic acid, oleic acid, stearic acid, linoleic acid, salicylic acid, benzoic acid, formic acid, malonic acid, phthalic acid, fumaric acid, citric acid and tartaric acid. Examples of alkali catalysts may include bases such as ammonia, sodium hydroxide, potassium hydroxide, barium hydroxide, calcium hydroxide, trimethylamine, triethylamine, triethanolamine, benzyldimethylamine, tetramethylammonium hydroxide, choline hydroxide and tetrabutylammonium hydroxide, and examples of a quaternary ammonium compound may include benzyltrimethylammonium chloride.

The polymers (1) and (2) obtained in this manner can also be used blended with one another. The blend ratio at this time may significantly affect the performance of the composition that is obtained, and thus they can be blended at any blend ratio that allows maximal performance. It may be further preferable that the mixture that is obtained is subjected to operations such as heating, mixing, ultrasonic radiation and kneading to give the polymer a uniform composition.

According to the invention, the organic solvent as component (B) may be any organic solvent that can dissolve the base resin, the acid generator, and other agents that may be added. Examples of such an organic solvent may include, but not limited to, ketones such as cyclohexanone and methyl-2-n-amylketone; alcohols such as 3-methoxybutanol, 3-methyl-3-methoxybutanol, 1-methoxy-2-propanol and 1-ethoxy-2-proponal; ethers such as propyleneglycol monomethyl ether, ethyleneglycol monomethyl ether, propyleneglycol monoethyl ether, ethyleneglycol monoethyl ether, propyleneglycol dimethyl ether and diethyleneglycol dimethyl ether, esters such as propyleneglycol monomethyl ether acetate, propyleneglycol monoethyl ether acetate, ethyl lactate, ethyl pyruvate, butyl acetate, methyl 3-methoxypropionate, ethyl 3-ethoxypropionate, tert-butyl acetate, tert-butyl propionate and propyleneglycol monotert-butyl ether acetate; and lactones such as γ-butyllactone. These can be used singly or as admixture of two or more solvents. In the present invention, the use of diethyleneglycol-dimethyl ether, 1-ethoxy-2-proponal, propyleneglycol monomethyl ether acetate, or a mixture of two or more thereof is preferable because, of the above organic solvents, these have best ability to dissolve the acid generator in the resist composition.

The amount of organic solvent may be preferably 500 to 2,000 weight parts, particularly preferably 400 to 3,000 weight parts, based on 100 weight parts of the polymer of Formula (1) or (2) (if applicable, based on the total amount of combined polymers).

In the present invention, it is possible to add an acid generator of component (B) in order to further accelerate the heat-induced crosslinking reaction. Some acid generators generate acid when thermally decomposed and others generate acid when irradiated with light, and either type of acid generator can be added.

Examples of the acid generator used in the present invention may include:

(i) onium salts of the formulas (P1a-1), (P1a-2), (P1a-3) or (P1b), (ii) diazomethane derivatives of the formula (P2), (iii) glyoxime derivatives of the formula (P3), (iv) bissulfone derivatives of the formula (P4), (v) sulfonate of N-hydroxyimide compounds of the formula (P5), (vi) β-ketosulfonic acid derivatives, (vii) disulfone derivatives, (viii) nitrobenzylsulfonate derivatives, and (ix) sulfonate derivatives.

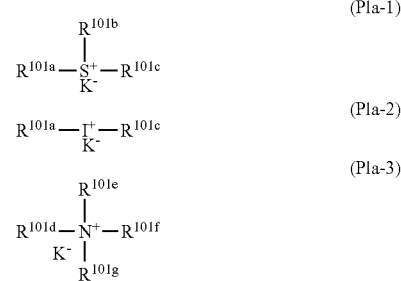

wherein $R^{101a}$, $R^{101b}$, and $R^{101c}$ each independently represents a straight, branched or cyclic alkyl, alkenyl, oxoalkyl or oxoalkenyl group having 1 to 12 carbon atoms, aryl group having 6 to 20 carbon atoms, or aralkyl or aryloxoalkyl group having 7 to 12 carbon atoms, wherein the hydrogen atoms of these groups can be partially or entirely substituted by an alkoxy or other group; $R^{101b}$ and $R^{101c}$ together can form a ring, and if forming a ring, $R^{101b}$ and $R^{101c}$ each represents an alkylene group having 1 to 6 carbon atoms. $K^-$ represents a non-nucleophilic counter ion; and $R^{101d}$, $R^{101e}$, $R^{101f}$ and $R^{101g}$ are $R^{101a}$, $R^{101b}$, and $R^{101c}$ to which hydrogen atoms have been added, $R^{101d}$ and $R^{101e}$, and $R^{101d}$ and $R^{101e}$ and $R^{101f}$ can form rings, and if forming a ring, $R^{101d}$ and $R^{101e}$, and $R^{101d}$ and $R^{101e}$ and $R^{101f}$ are alkylene groups having 3 to 10 carbon atoms.

$R^{101a}$, $R^{101b}$, $R^{101c}$, $R^{101d}$, $R^{101e}$, $R^{101f}$ and $R^{101g}$ can be the same or different, and specific examples thereof may include alkyl groups such as methyl, ethyl, propyl, isopropyl, n-butyl, sec-butyl, tert-butyl, pentyl, hexyl, heptyl, octyl, cyclopentyl, cyclohexyl, cycloheptyl, cyclopropylmethyl, 4-methylcyclohexyl, cyclohexylmethyl, norbornyl and adamantyl. Examples of alkenyl groups may include vinyl, allyl, propenyl, butenyl, hexenyl, and cyclohexenyl. Examples of oxoalkyl groups may include 2-oxocyclopentyl and 2-oxocyclohexyl, in addition to 2-oxopropyl, 2-cyclopentyl-2-oxoethyl, 2-cyclohexyl-2-oxoethyl, and 2-(4-methylcyclohexyl)-2-oxoethyl. Examples of aryl groups may include phenyl and naphthyl, alkoxyphenyl groups such as p-methoxyphenyl, m-methoxyphenyl, o-methoxyphenyl, ethoxyphenyl, p-tert-butoxyphenyl, and m-tert-butoxyphenyl, alkylphenyl groups such as 2-methylphenyl, 3-methylphenyl, 4-methylphenyl, ethylphenyl, 4-tert-butylphenyl, 4-butylphenyl, and dimethylphenyl, alkylnaphthyl groups such as methylnaphthyl and ethylnaphthyl, alkoxynaphthyl groups such as methoxynaphthyl and ethoxynaphthyl, dialkylnaphthyl groups such as dimethylnaphthyl and diethylnaphthyl, and dialkoxynaphthyl groups such as dimethoxynaphthyl and diethoxynaphthyl. Examples of aralkyl groups may include benzyl, phenylethyl, and phenethyl. Examples of aryloxoalkyl groups may include 2-aryl-2-oxoethyl groups such as 2-phenyl-2-oxoethyl, 2-(1-naphthyl)-2-oxoethyl, and 2-(2-naphthyl)-2-oxoethyl.

Examples of the non-nucleophilic counter ion indicated by $K^-$ may include halide ions such as chloride and bromide ions, fluoroalkylsulfonate ions such as triflate, 1,1,1-trifluoroethanesulfonate, and nonafluorobutanesulfonate, arylsulfonate ions such as tosylate, benzenesulfonate, 4-fluorobenzenesulfonate, and 1,2,3,4,5-pentafluorobenzene-sulfonate, and alkylsulfonate ions such as mesylate and butanesulfonate.

(P1a-1) and (P1a-2) have the effect of both photoacid generators and thermal acid generators, and (P1a-3) acts as a thermal acid generator.

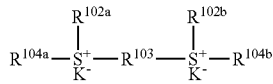
(P1b)

wherein $R^{102a}$ and $R^{102b}$ each independently represents a straight, branched or cyclic alkyl group having 1 to 8 carbon atoms; $R^{103}$ represents a straight, branched or cyclic alkylene group having 1 to 10 carbon atoms; $R^{104a}$ and $R^{104b}$ each independently represents an 2-oxoalkyl group having 3 to 7 carbon atoms; and $K^-$ is a non-nucleophilic counter ion.

Specific examples of the groups represented by $R^{102a}$ and $R^{102b}$ may include methyl, ethyl, propyl, isopropyl, n-butyl, sec-butyl, tert-butyl, pentyl, hexyl, heptyl, octyl, cyclopentyl, cyclohexyl, cyclopropylmethyl, 4-methylcyclohexyl and cyclohexylmethyl.

Examples of the groups represented by $R^{103}$ may include methylene, ethylene, propylene, butylene, pentylene, hexylene, heptylene, octylene, nonylene, 1,4-cyclohexylene, 1,2-cyclohexylene, 1,3-cyclopentylene, 1,4-cyclooctylene and 1,4-cyclohexanedimethylene.

Examples of the groups represented by $R^{104a}$ and $R^{104b}$ may include 2-oxopropyl, 2-oxocyclopentyl, 2-oxocyclohexyl and 2-oxocycloheptyl.

Examples of $K^-$ may include the same compounds as those illustrated by the formulae (P1a-1), (P1a-2) and (P1a-3).

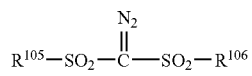
(P2)

wherein $R^{105}$ and $R^{106}$ independently represents a straight, branched or cyclic alkyl or halogenated alkyl group having 1 to 12 carbon atoms, aryl or halogenated aryl group having 6 to 20 carbon atoms, or aralkyl group having 7 to 12 carbon atoms.

Examples of the alkyl groups of $R^{105}$ and $R^{106}$ may include methyl, ethyl, propyl, isopropyl, n-butyl, sec-butyl, tert-butyl, pentyl, hexyl, heptyl, octyl, amyl, cyclopentyl, cyclohexyl, cycloheptyl, norbornyl and adamantyl.

Examples of the halogenated alkyl groups may include trifluoromethyl, 1,1,1-trifluoroethyl, 1,1,1-trichloroethyl and nonafluorobutyl.

Examples of the aryl groups of $R^{105}$ and $R^{106}$ may include phenyl, alkoxyphenyl groups such as p-methoxyphenyl, m-methoxyphenyl, o-methoxyphenyl, ethoxyphenyl, p-tert-butoxyphenyl and m-tert-butoxyphenyl, and alkylphenyl groups such as 2-methylphenyl, 3-methylphenyl, 4-methylphenyl, ethylphenyl, 4-tert-butylphenyl, 4-butylphenyl, and dimethylphenyl.

Examples of the halogenated aryl groups of $R^{105}$ and $R^{106}$ may include fluorophenyl, chlorophenyl and 1,2,3,4,5-pentafluorophenyl.

Examples of the aralkyl groups of $R^{105}$ and $R^{106}$ may include benzyl and phenethyl.

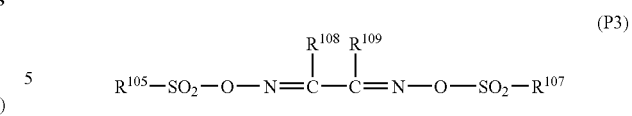
(P3)

wherein $R^{107}$, $R^{108}$ and $R^{109}$ each independently represents a straight, branched or cyclic alkyl or halogenated alkyl group having 1 to 12 carbon atoms, aryl or halogenated aryl group having 6 to 20 carbon atoms, or aralkyl group having 7 to 12 carbon atoms; and $R^{108}$ and $R^{109}$ can bond with one another to form a ring structure, and if the two form a ring structure, then $R^{108}$ and $R^{109}$ each is independently a straight or branched alkylene group having 1 to 6 carbon atoms.

Examples of the alkyl, halogenated alkyl, aryl, halogenated aryl, and aralkyl groups represented by $R^{107}$, $R^{108}$, and $R^{109}$ may be the same as those described for $R^{105}$ and $R^{106}$. It should be noted that examples of the alkylene groups represented by $R^{108}$ and $R^{109}$ include methylene, ethylene, propylene, butylene and hexylene.

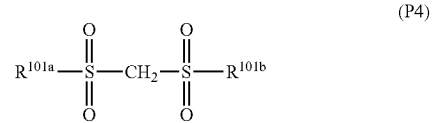
(P4)

wherein $R^{101a}$ and $R^{101b}$ have the same definitions as those discussed above.

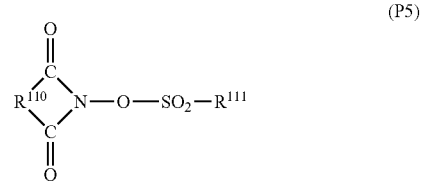
(P5)

Herein $R^{110}$ is an arylene group having 6 to 10 carbon atoms, alkylene group having 1 to 6 carbon atoms, or alkenylene group having 2 to 6 carbon atoms, wherein the hydrogen atoms of these groups may be partially or entirely substituted with a straight or branched alkyl or alkoxy groups having 1 to 4 carbon atoms, nitro, acetyl, or phenyl groups. The $R^{111}$ is a straight, branched or substituted alkyl, alkenyl, or alkoxyalkyl group having 1 to 8 carbon atoms, phenyl or naphthyl group. The hydrogen atoms of these groups for $R^{111}$ may be further partially or entirely substituted with an alkyl or alkoxy group having 1 to 4 carbon atoms; a phenyl group which may have been substituted with an alkyl or alkoxy group having 1 to 4 carbon atoms, nitro, or acetyl group, hetero-aromatic group having 3 to 5 carbon atoms; or chlorine or fluorine atom.

Of the groups represented by $R^{110}$, examples of arylene groups may include 1,2-phenylene and 1,8-naphthylene, examples of alkylene groups may include methylene, ethylene, trimethylene, tetramethylene, phenylethylene and norbornene-2,3-diyl, and examples of alkenylene groups may include 1,2-vinylene, 1-phenyl-1,2-vinylene and 5-norbornane-2,3-diyl.

Of the groups represented by $R^{111}$, examples of the alkyl groups may be the same as those described for $R^{101a}$ to $R^{101c}$. examples of alkenyl groups may include vinyl, 1-propenyl, allyl, 1-butenyl, 3-butenyl, isoprenyl, 1-pentenyl, 3-pentenyl, 4-pentenyl, dimethylallyl, 1-hexenyl, 3-hexenyl, 5-hexenyl, 1-heptenyl, 3-heptenyl, 6-heptenyl and 7-octenyl, and examples of alkoxyalkyl groups may include methoxymethyl, ethoxymethyl, propoxymethyl, butoxymethyl, pentyloxymethyl, hexyloxymethyl, heptyloxymethyl, methoxyethyl, ethoxyethyl, propoxyethyl, butoxyethyl, pentyloxyethyl, hexyloxyethyl, methoxypropyl, ethoxypropyl, propoxypropyl, butoxypropyl, methoxybutyl, ethoxybutyl, propoxybutyl, methoxypentyl, ethoxypentyl, methoxyhexyl and methoxyheptyl.

It should be noted that as regards the groups that can be further substituted, examples of alkyl groups having 1 to 4 carbon atoms may include methyl, ethyl, propyl, isopropyl, n-butyl, isobutyl and tert-butyl, and examples of alkoxy groups having 1 to 4 carbon atoms may include methoxy, ethoxy, propoxy, isopropoxy, n-butoxy, isobutoxy and tert-butoxy.

Examples of phenyl groups which may be substituted with an alkyl having 1 to 4 carbon atoms, alkoxy having 1 to 4 carbon atoms, nitro or acetyl group may include phenyl, tolyl, p-tert-butoxyphenyl, p-acetylphenyl and p-nitrophenyl, and examples of heteroaromatic groups having 3 to 5 carbon atoms may include pyridyl and furyl.

More specifically, examples of onium salts may include tetramethylammonium trifluoromethanesulfonate, tetramethylammonium nonafluorobutanesulfonate, tetra-n-butylammonium nonafluorobutanesulfonate, tetraphenylammonium nonafluorobutanesulfonate, tetramethylammonium p-toluenesulfonate, diphenyliodonium trifluoromethanesulfonate, (p-tert-butoxyphenyl) phenyliodonium sulfonate, diphenyliodonium p-toluenesulfonate, (p-tert-butoxyphenyl)phenyliodonium p-toluenesulfonate, triphenylsulfonium trifluoromethane sulfonate, (p-tert-butoxyphenyl)diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate, trinaphthylsulfonium trifluoromethanesulfonate, cyclohexylmethyl(2-oxocyclohexyl)sulfonium trifluoromethanesulfonate, (2-norbornyl)methyl(2-oxocyclohexyl)sulfonium trifluoromethanesulfonate, ethylenebis[methyl(2-oxocyclopentyl)sulfonium trifluoromethanesulfonate] and 1,2'-naphthylcarbonylmethyltetrahydrothiophenium triflate.

Examples of diazomethane derivatives may include bis(benzenesulfonyl)diazomethane, bis(p-toluenesulfonyl)diazomethane, bis(xylenesulfonyl)diazomethane, bis(cyclohexylsulfonyl)diazomethane, bis(cyclopentylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, bis(tert-butylsulfonyl)diazomethane, bis(n-amylsulfonyl)diazomethane, bis(isoamylsulfonyl)diazomethane, bis(sec-amylsulfonyl)diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane and 1-tert-amylsulfonyl-1-(tert-butylsulfonyl)diazomethane.

Examples of glyoxime derivatives may include bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(p-toluenesulfonyl)-2-methyl-3,4-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(n-butanesulfonyl)-2,3-pentanedioneglyoxime, bis-O-(n-butanesulfonyl)-2-methyl-3,4-pentanedioneglyoxime, bis-O-(methanesulfonyl)-α-dimethylglyoxime, bis-O-(trifluoromethanesulfonyl)-α-dimethylglyoxime, bis-O-(1,1,1-trifluoroethanesulfonyl)-α-dimethylglyoxime, bis-O-(tert-butanesulfonyl)-α-dimethylglyoxime, bis-O-(perfluorooctanesulfonyl)-α-dimethylglyoxime, bis-O-(cyclohexanesulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-tert-butylbenzenesulfonyl)-α-dimethylglyoxime, bis-O-(xylenesulfonyl)-α-dimethylglyoxime and bis-O-(camphorsulfonyl)-α-dimethylglyoxime.

Examples of bissulfone derivatives may include bisnaphthylsulfonylmethane, bistrifluoromethylsulfonylmethane, bismethylsulfonylmethane, bisethylsulfonylmethane, bispropylsulfonylmethane, bisisopropylsulfonylmethane, bis-p-toluenesulfonylmethane and bisbenzenesulfonylmethane.

Examples of β-ketosulfone derivatives may include 2-cyclohexyl-carbonyl-2-(p-toluenesulfonyl)propane and 2-isopropyl-carbonyl-2-(p-toluenesulfonyl)propane.

Examples of nitrobenzyl sulfonate derivatives may include 2,6-dinitrobenzyl p-toluenesulfonate and 2,4-dinitrobenzyl p-toluenesulfonate.

Examples of sulfonate derivatives may include 1,2,3-tris(methanesulfonyloxy)benzene, 1,2,3-tris(trifluoromethanesulfonyloxy)benzene and 1,2,3-tris(p-toluenesulfonyloxy)benzene.

Examples of sulfonate derivatives of N-hydroxyimide compounds may include N-hydroxysuccinimide methanesulfonate, N-hydroxysuccinimide trifluoromethanesulfonate, N-hydroxysuccinimide ethanesulfonate, N-hydroxysuccinimide 1-propanesulfonate, N-hydroxysuccinimide 2-propanesulfonate, N-hydroxysuccinimide 1-pentanesulfonate, N-hydroxysuccinimide 1-octanesulfonate, N-hydroxysuccinimide p-toluenesulfonate, N-hydroxysuccinimide p-methoxybenzenesulfonate, N-hydroxysuccinimide 2-chloroethanesulfonate, N-hydroxysuccinimide benzenesulfonate, N-hydroxysuccinimide 2,4,6-trimethylbenzenesulfonate, N-hydroxysuccinimide 1-naphthalenesulfonate, N-hydroxysuccinimide 2-naphthalenesulfonate, N-hydroxy-2-phenylsuccinimide methanesulfonate, N-hydroxymaleimide methanesulfonate, N-hydroxymaleimide ethanesulfonate, N-hydroxy-2-phenylmaleimide methanesulfonate, N-hydroxyglutarimide methanesulfonate, N-hydroxyglutarimide benzenesulfonate, N-hydroxyphthalimide methanesulfonate, N-hydroxyphthalimide benzenesulfonate, N-hydroxyphthalimide trifluoromethanesulfonate, N-hydroxyphthalimide p-toluenesulfonate, N-hydroxynaphthalimide methanesulfonate, N-hydroxynaphthalimide benzenesulfonate, N-hydroxy-5- norbornene-2,3-dicarboxyimide methanesulfonate, N-hydroxy-5-norbornene-2,3-dicarboxyimide trifluoromethanesulfonate and N-hydroxy-5-norbornene-2,3-dicarboxyimide p-toluenesulfonate.

Preferable among these may be onium salts such as triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, tris(p-tert-butoxyphenyl)sulfonium p-toluenesulfonate, trinaphthylsulfonium trifluoromethanesulfonate, cyclohexylmethyl(2-oxocyclohexyl)sulfonium trifluoromethanesulfonate, (2-norbornyl)methyl(2-oxocylohexyl)sulfonium trifluoromethanesulfonate and 1,2'-naphthylcarbonylmethyltetrahydrothiophenium triflate; diazomethane derivatives such as bis(benzenesulfonyl)diazomethane, bis(p-toluenesulfonyl)diazomethane, bis(cyclohexylsulfonyl)diazomethane, bis(n-butylsulfonyl)diazomethane, bis(isobutylsulfonyl)diazomethane, bis(sec-butylsulfonyl) diazomethane, bis(n-propylsulfonyl)diazomethane, bis (isopropylsulfonyl)diazomethane, and bis(tert-butylsulfonyl)diazomethane, glyoxime derivatives such as bis-O-(p-toluenesulfonyl)-α-dimethylglyoxime and bis-O-(n-butanesulfonyl)-α-dimethylglyoxime; bissulfone derivatives such as bisnaphthylsulfonylmethane; and sulfonate derivatives of N-hydroxyimide compounds such as N-hydroxysuccinimide methanesulfonate, N-hydroxysuccinimide trifluoromethanesulfonate, N-hydroxysuccinimide 1-propanesulfonate, N-hydroxysuccinimide 2-propanesulfonate, N-hydroxysuccinimide 1-pentanesulfonate, N-hydroxysuccinimide p-toluenesulfonate, N-hydroxynaphthalimide methanesulfonate, and N-hydroxynaphthalimide benzenesulfonate.

It should be noted that the acid generator may be used singly or in admixture of two or more types.

The amount of acid generator may be preferably 0.1 to 50 weight parts, more preferably 0.5 to 40 weight parts, with respect to 100 weight parts polymer of Formula (1) or (2) (or if both are used, the total of the two). When there is less than 0.1 weight parts, too little acid may be generated and the crosslinking reaction may be insufficient, whereas when there is more than 50 weight parts, there may be the problem that mixing may occur due to the acid moving to the upper layer resist.

Here, a crosslinking agent of the component (D) may be a material for crosslinking with the polymer of Formula (1) or (2) in the presence of acid (such as trifluoromethanesulfonic acid, trifluorobutanesulfonic acid, p-toluenesulfonic acid, benzenesulfonic acid, methanesulfonic acid and ethanesulfonic acid). Examples of the crosslinking agent may include melamine compounds, guanamine compounds, glycoluril compounds or urea compounds, epoxy compounds, thioepoxy compounds, isocyanate compounds azide compounds, and compounds comprising a double bond such as an alkenyl ether group, in which there has been a substitution by at least one group selected from methylol, alkoxymethyl and acyloxymethyl.

Of the crosslinking agents, examples of epoxy compounds which have been substituted by at least one group selected from methylol, alkoxymethyl and acyloxymethyl may include tris(2,3-epoxypropyl)isocyanurate, trimethylolmethane triglycidyl ether, trimethylolpropane triglycidyl ether and triethylolethane triglycidyl ether.

Of the crosslinking agents, examples of melamine compounds which have been substituted by at least one group selected from methylol, alkoxymethyl and acyloxymethyl may include hexamethylolmelamine, hexamethoxymethylmelamine, compounds obtained by methoxymethylating 1 to 6 methylol groups of hexamethylolmelamines and mixtures thereof, hexamethoxyethylmelamine, hexaacyloxymethylmelamine and compounds obtained by acyloxymethylating 1 to 5 methylol groups of hexamethylolmelamine and mixtures thereof.

Of the crosslinking agents, examples of guanamine compounds which have been substituted by at least one group selected from methylol, alkoxymethyl and acyloxymethyl may include tetramethylolguanamine, tetramethoxymethylguanamine, compounds obtained by methoxymethylating 1 to 4 methylol groups of tetramethylolguanamine and mixtures thereof, tetramethoxyethylguanamine, tetraacyloxyguanamine, and compounds obtained by acyloxymethylating 1 to 4 methylol groups of tetramethylolguanamine and mixtures thereof.

Of the crosslinking agents, examples of glycoluril compounds which have been substituted by at least one group selected from methylol, alkoxymethyl and acyloxymethyl may include tetramethylolglycoluril, tetramethoxyglycoluril, tetramethoxymethylglycoluril, compounds obtained by methoxymethylating 1 to 4 methylol groups of tetramethylolglycoluril and mixtures thereof, and compounds obtained by acyloxymethylating 1 to 4 methylol groups of tetramethylolglycoluril and mixtures thereof.

Of the crosslinking agents, examples of urea compounds which have been substituted by at least one group selected from methylol, alkoxymethyl and acyloxymethyl may include tetramethylolurea, tetramethoxymethylurea, tetramethoxyethylurea and compounds obtained by methoxymethylating 1 to 4 methylol groups of tetramethylolurea and mixtures thereof.

Of the crosslinking agents, examples of compounds containing an alkenyl ether group which have been substituted by at least one group selected from methylol, alkoxymethyl and acyloxymethyl may include ethyleneglycol divinyl ether, triethyleneglycol divinyl ether, 1,2-propanediol divinyl ether, 1,4-butanediol divinyl ether, tetramethyleneglycol divinyl ether, neopentylglycol divinyl ether, trimethylolpropane trivinyl ether, hexanediol divinyl ether, 1,4-cyclohexanediol divinyl ether, pentaerythritol trivinyl ether, pentaerythritol tetravinyl ether, sorbitol tetravinyl ether, sorbitol pentavinyl ether and trimethylolpropane trivinyl ether.

If the crosslinking agent of $R^{1a}$ contains an epoxy, then it is effective to add a compound containing a hydroxyl group in order to raise reactivity with the epoxy and increase crosslinking efficiency.

A compound that comprises two or more hydroxyl groups within the molecule may be particularly preferable. Examples thereof may include alcohol group-containing compounds such as 4,8-bis(hydroxymethyl)tricyclo[5.2.1.0²,⁶]-decane, pentaerythritol, 1,2,6-hexanetriol, 4,4', 4"-methylidene triscyclohexanol, 4,4'-[1-[4-[1-(4-hydroxycyclohexyl)-1-methylethyl]phenyl]ethtylidene] biscyclohexanol, [1,1'-bicyclohexyl]-4,4'-diol, methylenebiscyclohexanol, decahydronaphthalene-2,6-diol, and [1,1'-bicyclohexyl]-3,3',4,4'-tetrahydroxy; and a phenol-type compound such as bisphenol, methylenebisphenol, 2,2'-methylenebis[4-methylphenol], 4,4'-methylidene-bis[2,6-dimethylphenol], 4-4'-(1-methyl-ethylidene)bis[2-methylphenol], 4-4'-cyclohexylidenebisphenol, 4,4'-(1,3-dimethylbutylidene)bisphenol, 4,4'-(1-methylethylidene)bis[2,6-di-methylphenol], 4,4'-oxybisphenol, 4,4'-methylenebisphenol, bis(4-hydroxyphenyl)methanol, 4,4'-methylenebis[2-methylphenol], 4,4'-[1,4-phenylenebis(1-methylethylidene)]bisphenol, 4,4'-(1,2-ethanediol)

bisphenol, 4,4'-(diethylsilylene)bisphenol, 4,4'-[2,2,2-trifluoro-1-(trifluoromethyl)ethylidene]bisphenol, 4,4',4"-methylidenetrisphenol, 4,4'-[1-(4-hydroxyphenyl)-1-methylethyl]phenyl]ethylidene]bisphenol, 2,6-bis[(2-hydroxy-5-methylphenyl)methyl]-4-methylphenol, 4,4',4"-ethylidynetris[2-methylphenol], 4,4',4"-ethylidynetrisphenol, 4,6-bis[(4-hydroxyphenyl)methyl]1,3-benzenediol, 4,4'-[(3,4-dihydroxyphenyl)methylene]bis[2-methylphenol], 4,4',4",4'''-(1,2-ethanediylidene) tetrakisphenol, 4,4',4",4'''-(ethanediylidene)tetrakis[2-methylphenol], 2,2'-methylenebis[6-[(2-hydroxy-5-methylphenyl)methyl]-4-methylphenol], 4,4',4",4'''-(1,4-phenylenedimethylidyne)tetrakisphenol, 2,4,6-tris(4-hydroxyphenylmethyl)1,3-benzenediol, 2,4',4"-methylidenetrisphenol, 4,4',4'''-(3-methyl-1-propanyl-3-ylidene)trisphenol, 2,6-bis[(4-hydroxy-3-fluorophenyl) methyl]-4-fluorophenol, 2,6-bis[4-hydroxy-3-fluorophenyl] methyl]-4-fluorophenol, 3,6-bis[(3,5-dimethyl-4-hydroxyphenyl)methyl]1,2-benzenediol, 4,6-bis[(3,5-dimethyl-4-hydroxyphenyl)methyl]1,3-benzenediol, p-methylcalix[4]arene, 2,2'-methylenebis[6-[(2,5/3,6-dimethyl-4/2-hydroxyphenyl)methyl]-4-methylphenol, 2,2'-methylenebis[6-[(3,5-dimethyl-4-hydroxyphenyl)methyl]-4-methylphenol, 4,4',4",4'''-tetrakis[(1-methylethylidene)bis (1,4-cyclohexylidene)]phenol, 6,6'-methylenebis[4-(4-hydroxyphenolmethyl)-1,2,3-benzenetriol, and 3,3',5,5'-tetrakis[(5-methyl-2-hydroxyphenyl)methyl]-[(1,1'-biphenyl)-4,4'-diol].

On the other hand, if the epoxy group of $R^{1a}$ is modified to contain a hydroxide group, then it is effective to add a compound that comprises an epoxy group in order to raise reactivity with the hydroxyl group and increase crosslinking efficiency. A compound that comprises two or more epoxy groups within the molecule is particularly preferable. Examples thereof include tris(2,3-epoxypropyl)isocyanurate, trimethlolmethane triglycidyl ether, trimethylolpropane triglycidyl ether, and triethyloethane triglycidyl ether.

According to the invention, the amount of hydroxy-containing additive or epoxy-containing additive may be preferably 5 to 50 weight parts, particularly preferably 10 to 40 weight parts, with respect to 100 weight parts polymer of Formula (1) or (2) (or if both are used, the total of the two). When there is less than 5 weight parts, mixing with the resist may occur, whereas when there is more than 50 weight parts, the antireflective effect may drop or cracks may appear in the film after crosslinking.

Next, the present invention provides a pattern formation method for forming a pattern in a substrate through lithography, wherein at least the antireflective film material of the present invention is applied onto a substrate and baked to form an antireflective film, a photoresist film material is applied onto that antireflective film and prebaked to form a photoresist film, a pattern circuit region of the photoresist film is exposed to light and then it is developed with a developing liquid to form a resist pattern in the photoresist film, and with the photoresist film in which the resist pattern has been formed serving as a mask, the antireflective film and the substrate are etched, forming a pattern in the substrate.

Furthermore, the present invention also provides a pattern formation method for forming a pattern in a substrate through lithography, wherein at least the antireflective film material of the present invention is applied onto a substrate and baked to form an antireflective film, a photoresist film material is applied onto that antireflective film and prebaked to form a photoresist film, a pattern circuit region of the photoresist film is exposed and then it is developed with a developing liquid to form a resist pattern in the photoresist film, the antireflective film is etched with the photoresist film in which the resist pattern has been formed serving as a mask, and then the substrate is etched with the antireflective film in which the pattern has been formed serving as a mask, forming a pattern in the substrate.

These pattern formation methods are described with reference to FIG. 1.

First, the procedure up to resist pattern formation shown in FIG. 1(a) is described.

An antireflective film 10 can be formed by applying the antireflective film material of the present invention onto a substrate 12 through spin coating or the like. After application by spin coating or the like, the organic solvent is vaporized and preferably baking is performed to advance the crosslinking reaction in order to prevent mixing with a photoresist film 11, which becomes the upper layer. The baking temperature is preferably within a range of 80 to 300° C. and the baking time may be preferably within a range of 10 seconds to 300 seconds.

After the antireflective film 10 has been formed, the photoresist film 11 is formed thereon preferably through spin-coating as when forming the antireflective film. Prebaking is performed after the photoresist film material has been applied by spin coating or the like. The prebake conditions are preferably a temperature within the range of 80 to 180° C. and a baking time within a range of 10 to 300 seconds. Next, the pattern circuit region is exposed to light, subjected to a post-exposure bake (PEB), and developed with the developing liquid, yielding a resist pattern (FIG. 1(a)).

Pattern formation up to the state shown in FIG. 1(b) is described next.

The antireflective film 10 is etched with the photoresist film 11 serving as a mask, and this etching may be carried out using fluorocarbon, nitrogen or carbon dioxide gases, for example. The antireflective film 10 formed from the antireflective film material of the present invention is characterized in that it is quickly etched by the gas and that there is little reduction of the above photoresist film 11.

As regards the etching of the substrate 12 that follows, if $SiO_2$ or SiN is the layer to be processed 12a on the primer layer 12b, then etching with fluorocarbon gas as a primary component may be performed, and if it is p-Si (p-type Si), Al, or W, then etching with chlorine gas or bromine gas as a primary component may be performed. The antireflective film 10 formed from the antireflective film material of the present invention has excellent etching resistance with respect to chlorine and bromine, and particularly if the layer to be processed is p-Si, Al, or W, then it can be adopted as a hard mask. Even if the layer to be processed 12a is a $SiO_2$ or SiN film, the antireflective film 10 formed from the antireflective film material of the present invention has a faster etching speed than the photoresist film 11 but a slower etching speed than that of the substrate 12, thus allowing it to function as a hard mask.

Consequently, if the layer to be processed 12a of the substrate 12 is to be removed by etching to form a pattern, then this processing can be carried out with the photoresist film 11 serving as a mask or with the antireflective film 10 in which the pattern has been formed serving as a mask.

Furthermore, the present invention also provides a pattern formation method for forming a pattern in a substrate through lithography, wherein at least an organic film is formed on a substrate, the antireflective film material of the present invention is applied onto the organic film and baked to form an antireflective film, a photoresist film material is applied onto that antireflective film and prebaked to form a photoresist film, a pattern circuit region of the photoresist film is exposed to light and then it is developed with a developing liquid to form a resist pattern in the photoresist film, the antireflective film is etched with the photoresist film in which the resist pattern has been formed serving as a mask, the organic film is etched with the antireflective film in which the pattern has been formed serving as a mask, and then the substrate is etched, forming the pattern in the substrate.

Figure 2:
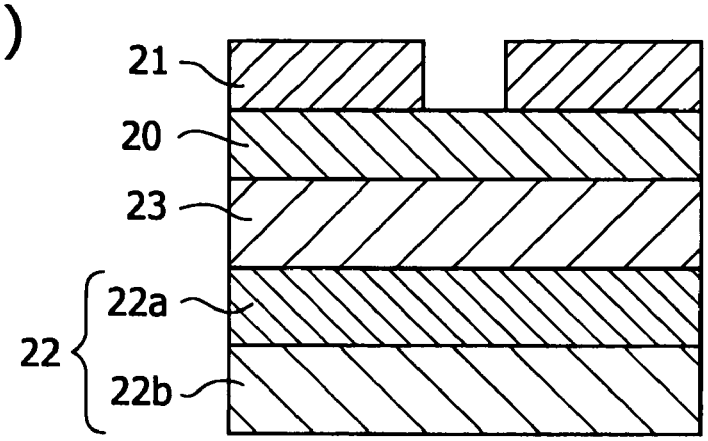
FIG. 2 is a diagram related to another pattern formation method of the present invention, and shows the resist pattern (a) after developing, the pattern (b) transferred to the antireflective film, the pattern (c) transferred to the organic film, and the pattern (d) after dry-etching the substrate.
Figure 2:
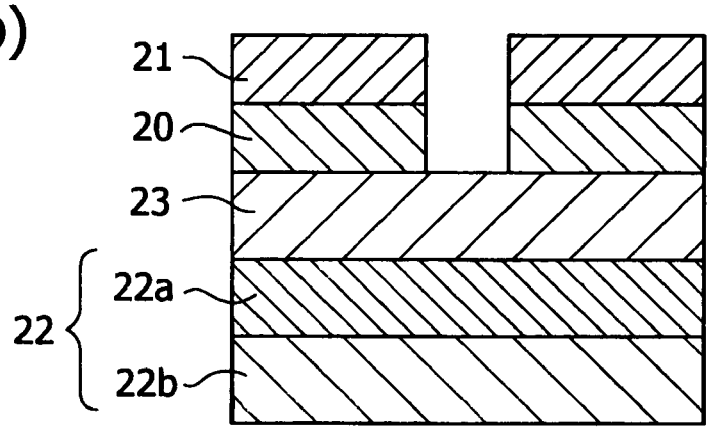
Figure 2:
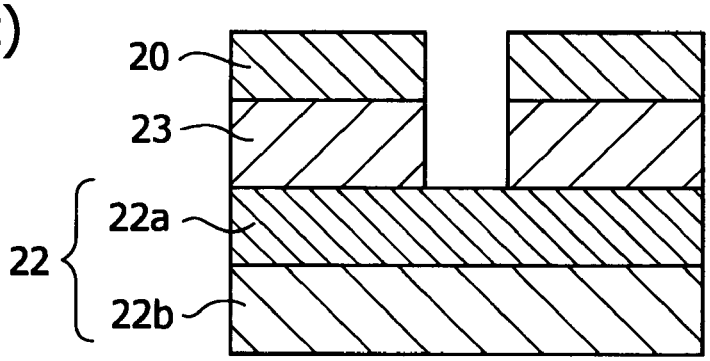
Figure 2:
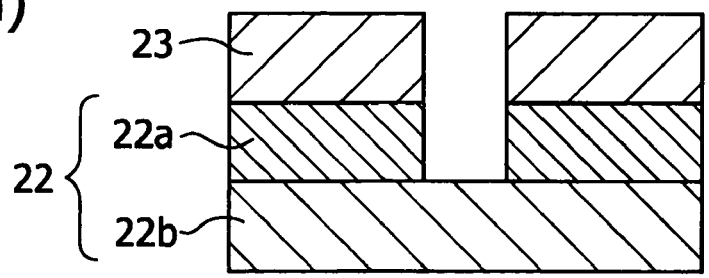

Thus, the antireflective film that is formed from the antireflective film material of the present invention can also be adopted as an intermediate layer in a multilayer resist process such as a three-layer resist process, for example. This pattern formation method is described with reference to FIG. 2.

First, the procedure up to resist pattern formation shown in FIG. 2(a) is described.

An organic film 23 can be formed on a substrate 22 by spin-coating or the like. The organic film 23 acts as a mask when the substrate 22 is etched, and thus it preferably has high etching resistance. In addition, it should not mix with a silicon-containing antireflective film 20 on it. Hence, it is preferably crosslinked thermally or by acid after being applied by spin-coating or the like. The antireflective film 20 from the antireflective film material of the present invention and a photoresist film 21 may be formed on the organic film 23 through the same method as that described above. A resist pattern is then obtained by exposing the pattern circuit region to light and developing it with the developing liquid (FIG. 2(a)).

Here, examples of the organic film may include resins such as cresol novolac, naphthol novolac, cathol dicyclopentadiene novolac, amorphous carbon, polyhydroxystyrene, acrylate, methacrylate, polyimide and polysulfone.

Next, as shown in FIG. 2(b), the antireflective film 20 may be etched with the photoresist film 21 in which the pattern has been formed serving as a mask, transferring the resist pattern to the antireflective film 20. Then, as shown in FIG. 2(c), the pattern formed in the antireflective film 20 may be transferred to the organic film 23 by oxygen plasma etching or the like. At this time the photoresist 21 is also simultaneously removed by etching. Next, as shown in FIG. 2(d), a layer 22a to be processed on a primer layer 22b may be etched to form the pattern in the substrate 22.

As regards the thickness of the films and the layers, the organic film may be from 50 to 2000 nm, the antireflective film is from 50 to 2000 nm, and the resist film may be from 0.1 to 1 μm (preferably from 100 to 500 nm), for example, but there is no limitation to these.

The resist composition used to form the resist layer can be a publicly known composition, and for example it is possible to use a combination of a base resin, an organic solvent, and an acid generator.

As the base resin, it is possible to use polyhydroxystyrene or derivatives thereof, polyacrylic acid or derivatives thereof, polymethacrylic acid or derivatives thereof, copolymers formed from monomers selected from hydroxystyrene, acrylic acid, methacrylic acid and derivates thereof, copolymers formed from three or more monomers selected from cycloolefin and derivatives thereof, maleic anhydride, and acrylic acid and derivatives thereof, copolymers formed from three or more monomers selected from cycloolefin and derivatives thereof, maleimide, and acrylic acid and derivatives thereof, and one or more polymers selected from the group consisting of polynorbornene and a metathesis ring-opened polymer. It should be noted that the derivative here means compounds in which the primary backbone remains after derivation, such that acrylic acid derivatives include acrylic ester, methacrylic acid derivatives include methacrylic ester, and hydroxystyrene derivates include alkoxystyrene.

For the resist for use with a KrF excimer laser, examples may include, but not limited to, polyhydroxystyrene (PHS) and copolymers formed from monomers selected from hydroxystyrene, styrene, acrylates, methacrylates and maleimide N carboxylates. And for the resist for use with an ArF excimer laser, examples may include, but not limited to, polyacrylates, polymethacrylates, alternating copolymers of norbornene and maleic anhydride, alternating copolymer of tetracyclododecene and maleic anhydride, polynorbornene and metathesis polymers obtained by ring-opening polymerization.

In the case of positive-type resists, typically the dissolving speed of non-exposed portions is lowered by substituting the hydroxyl group of phenol or carboxyl groups with an acid labile group. That is, the hydrogen atom of a carboxyl group or the hydrogen atom of a phenolic hydroxyl group is substituted by an acid labile group having the ability to control alkali dissolution, and due to the action of the acid that is generated by exposure to light, the acid-labile group is dissociated and combined with a base resin in which dissolution in the alkaline aqueous solutions is increased, and this can be used as the positive-type resist material.

The same organic solvent of component (B) and the acid generator of component (C) of the antireflective film material can be employed as the organic solvent and the acid generator used in the resist composition.

As regards the amount of each component of the resist composition, the content of base resin may be the same as the amount of the polymer of Formula (1) or (2) (or if both are used, the total of the two) of component (A) in the antireflective film material, and the amounts of organic solvent and acid generator used in the resist composition may be the same as the amounts of organic solvent of component (B) and acid generator of component (C) in the antireflective film material.

Hereinafter the present invention is described in further detail through synthesis examples, polymerization examples, and working examples, but the present invention is not limited to the following descriptions.

SYNTHESIS EXAMPLE 1

The 1400 g of methanol, 700 g of pure water and 50 g of aqueous 25 wt % solution of tetramethylammonium hydroxide were placed in a 3000 ml glass flask and stirred. To this mixture was added a mixture of 217 g of 3-glycidoxypropyltrimethoxysilane and 43 g of phenyltrimethoxysilane in a dropwise manner at a liquid temperature of 40° C. and then stirred for two hours at 40° C. After reaction was over, 35 g of acetic acid was added to stop the reaction and the methanol was removed by distillation under reduced pressure. The 2000 ml of ethyl acetate was added to the solution thus obtained. After the water phase was removed, the organic liquid phase was washed twice with ultrapure water, and 600 g of propylene glycol monomethyl ether acetate (PGMEA) was added, and under reduced pressure while heating the liquid to a temperature of 40° C., Polymer 1 was obtained.

The weight-average molecular weight (Mw) was obtained by gel permeation chromatography (GPC) using a polystyrene standard, and with $^{13}$C-NMR the copolymerization ratio was found to be the following.

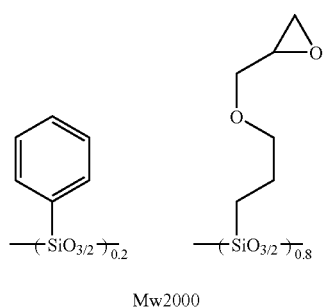

Polymer 1

Mw2000

SYNTHESIS EXAMPLE 2

The 1400 g of ethanol, 700 g of pure water and 50 g of an aqueous 25 wt % solution of tetramethylammonium hydroxide were placed in a 3000 ml glass flask and stirred. To this mixture was added a mixture of 139 g of 2-(3,4-epoxycyclohexyl)ethyl trimethoxysilane and 32 g of phenyltrimethoxysilane in a dropwise manner at a liquid temperature of 40° C. and then stirred for two hours at 40° C. After reaction was over, 35 g of acetic acid was added to stop the reaction and the ethanol was removed by distillation under reduced pressure. The 2000 ml of ethyl acetate was added to the liquid thus obtained. After the water phase was removed, the organic liquid phase was washed twice with ultrapure water, and 600 g of propylene glycol monomethyl ether acetate (PGMEA) was added, and under reduced pressure while heating the liquid to a temperature of 40° C., Polymer 2 was obtained.

The weight-average molecular weight (Mw) was obtained by gel permeation chromatography (GPC) using a polystyrene standard, and with $^{13}$C-NMR the copolymerization ratio was found to be the following.

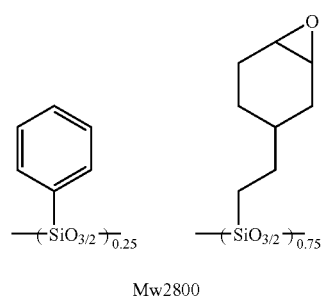

Polymer 2

Mw2800

SYNTHESIS EXAMPLE 3

The 1400 g of ethanol, 700 g of pure water and 50 g of an aqueous 25 wt % solution of tetramethylammonium hydroxide were placed in a 3000 ml glass flask and stirred. To this mixture was added a mixture of 139 g of 2-(3,4-epoxycyclohexyl)ethyl trimethoxysilane and 32 g of phenyltrimethoxysilane in a dropwise manner at a liquid temperature of 40° C. and then stirred for two hours at 40° C. After reaction was over, 35 g of acetic acid was added to stop the reaction and the ethanol was removed by distillation under reduced pressure. The 2000 ml of ethyl acetate was added to the liquid thus obtained. After the water phase was removed, the organic liquid phase was washed twice with ultrapure water, 1000 g of acetic acid was added, and the ether acetate was removed by distillation under reduced pressure while heating the liquid to a temperature of 40° C. The polymer acetic acid solution thus obtained was stirred for 12 hours at 40° C. Next, 600 g of propylene glycol monomethyl ether acetate (PGMEA) was added to the solution thus obtained, and under reduced pressure while heating the liquid to a temperature of 40° C., Polymer 3 was obtained.

The weight average molecular weight (Mw) was obtained by gel permeation chromatography (GPC) using a polystyrene standard, and with $^{13}$C-NMR the copolymerization ratio was found to be the following.

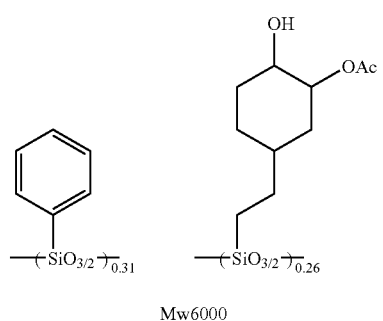

Polymer 3

Mw6000

SYNTHESIS EXAMPLE 4

The 1400 g of methanol, 700 g of pure water and 50 g of an aqueous 25 wt % solution of tetramethylammonium hydroxide were placed in a 3000 ml glass flask and stirred. To this mixture was added a mixture of 217 g of 3-glycidoxypropyltrimethoxysilane and 43 g of phenyltrimethoxysilane in a dropwise manner at a liquid temperature of 40° C. and then stirred for two hours at 40° C. After reaction was over, 35 g of acetic acid was added to stop the reaction and the methanol was removed by distillation under reduced pressure. The 2000 ml of ethyl acetate was added to the liquid thus obtained. After the water phase was removed, the organic liquid phase was washed twice with ultrapure water, 1000 g of acetic acid was added, and the ethyl acetate was removed by distillation under reduced pressure while heating the liquid to a temperature of 40° C. The 1.6 g of 60 wt % perchloric acid aqueous solution was added at room temperature to the polymer acetic acid solution thus obtained and stirred for 45 hours at 70° C. The 3000 ml of ethyl acetate was added to the polymer solution thus obtained. After the water phase was removed, the organic liquid phase was washed twice with ultrapure water, and then 600 g of propylene glycol monomethyl ether acetate (PGMEA) was added to the solution thus obtained, and under reduced pressure while heating the liquid to a temperature of 40° C., Polymer 4 was obtained.

The weight-average molecular weight (Mw) was obtained by gel permeation chromatography (GPC) using a polystyrene standard, and with $^{13}$C-NMR the copolymerization ratio was found to be the following.

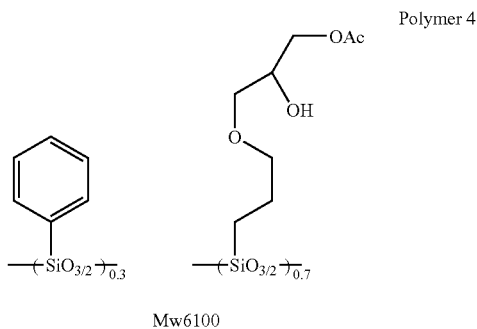

Polymer 4
Mw6100

SYNTHESIS EXAMPLE 5

The 1400 g of methanol, 700 g of pure water and 50 g of an aqueous 25 wt % solution of tetramethylammonium hydroxide were placed in a 3000 ml glass flask and stirred. To this mixture was added a mixture of 217 g of 3-glycidoxypropyltrimethoxysilane and 43 g of phenyltrimethoxysilane in a dropwise manner at a liquid temperature of 40° C. and then stirred for two hours at 40° C. After reaction was over, 35 g of acetic acid was added to stop the reaction and the methanol was removed by distillation under reduced pressure. The 2000 ml of ethyl acetate was added to the liquid thus obtained. After the water phase was removed, the organic liquid phase was washed twice with ultrapure water and the ethyl acetate was removed by distillation under reduced pressure while heating the liquid to a temperature of 40° C. The polymer thus obtained was dissolved in 1000 ml of methanol, 5 g of 1,8-diazabicyclo[5.4.0]undeca-7-ene (DBU) was added at room temperature, and this was stirred for 40 hours at 65° C. The 25 g of acetic acid was added to the polymer solution thus obtained to stop the reaction, and then the methanol was removed by distillation under reduced pressure at 40° C. The 3000 ml of ethyl acetate was added to the polymer thus obtained. After the water layer was removed, the organic liquid phase was washed twice with ultrapure water, and then 600 g of propylene glycol monoethyl ether acetate (PGMEA) was added, and under reduced pressure while heating the liquid to a temperature of 40° C., Polymer 5 was obtained.

The weight-average molecular weight (Mw) was obtained by gel permeation chromatography (GPC) using a polystyrene standard, and with $^{13}C$-NMR the copolymerization ratio was found to be the following.

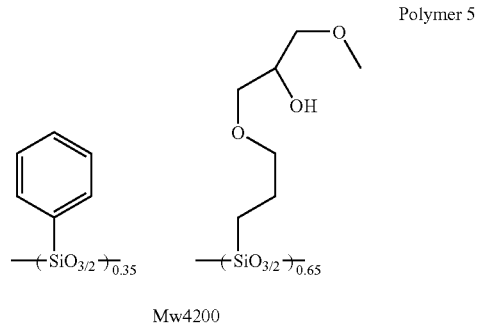

Polymer 5
Mw4200

SYNTHESIS EXAMPLE 6

The 1400 g of ethanol, 700 g of pure water and 50 g of an aqueous 25 wt % solution of tetramethylammoniumhydroxide were placed in a 3000 ml glass flask and stirred. To this mixture was added a mixture of 139 g of 2-(3,4-epoxycyclohexyl)ethyltrimethoxysilane and 32 g of phenyltrimethoxysilane in a dropwise manner at a liquid temperature of 40° C. and then stirred for two hours at 40° C. After reaction was over, 35 g of acetic acid was added to stop the reaction and the ethanol was removed by distillation under reduced pressure. The 2000 ml of ethyl acetate was added to the liquid thus obtained. After the water layer was removed, the organic liquid phase was washed twice with ultrapure water and the ethyl acetate was removed by distillation under reduced pressure while heating the liquid to a temperature of 40° C. The polymer thus obtained was dissolved in a mixture solution of 1000 ml of methanol and 1000 ml of tetrahydrofuran, 5 g of 1,8-diazabicyclo[5.4.0]undeca-7-ene (DBU) was added at room temperature, and this was stirred for 30 hours at 65° C. The 25 g of acetic acid was added to the polymer solution thus obtained to stop the reaction, and then the ethanol and the tetrahydrofuran were removed by distillation under reduced pressure at 40° C. The 3000 ml of ethyl acetate was added to the polymer thus obtained. After the water phase was removed, the organic liquid phase was washed twice with ultrapure water, and then 600 g of propylene glycol monomethyl ether acetate (PGMEA) was added, and under reduced pressure while heating the liquid to a temperature of 40° C., Polymer 6 was obtained.

The weight-average molecular weight (Mw) was obtained by gel permeation chromatography (GPC) using a polystyrene standard, and with $^{13}C$-NMR the copolymerization ratio was found to be the following.

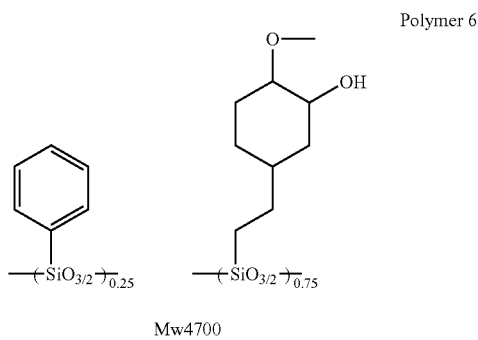

Polymer 6
Mw4700

COMPARATIVE SYNTHESIS EXAMPLE 1

The 23.6 g of 3-glycidoxypropyltrimethoxysilane and 19.8 g of phenyltrimethoxysilane were dissolved in 200 g of tetrahydrofuran (THF) and 100 g of pure water and the liquid temperature was set to 35° C., 21 g of 37 wt % aqueous hydrochloric acid was added dropwise over one hour. Then, the temperature was raised to 64° C. and condensation of the silanol, the ring-opening reaction of the epoxy group, and the addition reaction of the hydrochloric acid were carried out. The 200 g of diethyl ether was added to this reaction solution. After the water phase was removed, the organic liquid phase was washed twice with ultrapure water, 200 g of propylene glycol monomethyl ether acetate (PGMEA) was added, and the THF and aqueous diethyl ether were removed under reduced pressure while heating the liquid to a temperature of 60° C., thereby yielding Comparative Polymer 1.

The weight-average molecular weight (Mw) was obtained by gel permeation chromatography (GPC) using a polystyrene standard, and with $^{13}$C-NMR the copolymerization ratio was found to be the following.

Reference Polymer 1

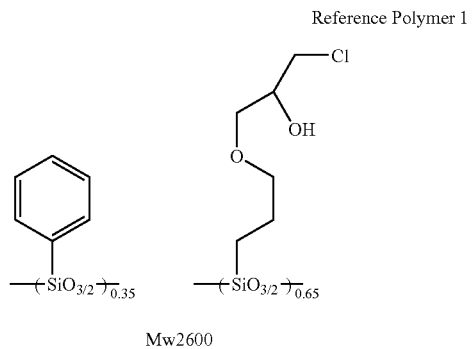

Mw2600

COMPARATIVE SYNTHESIS EXAMPLE 2

The 42.6 g of 2-(3,4-epoxycyclohexyl)ethyl trimethoxysilane and 19.8 g of phenyltrimethoxysilane were dissolved in 200 g of tetrahydrofuran and 100 g of pure water, the liquid temperature was set to 35° C., 1.7 g of tetramethylammoniumhydroxide was added. Then, the temperature was raised to 60° C. and condensation of the silanol was performed.

The 200 g of diethyl ether was added to this reaction solution. After the water layer was removed, 60 wt % nitric acid was added in an amount of 1% based on the weight of the organic liquid phase. The resulting organic liquid phase was washed twice times with 300 g of ultrapure water, 200 g of propylene glycol monomethyl ether acetate (PGMEA) was added, and the THF and aqueous diethyl ether were removed under reduced pressure while heating the liquid to a temperature of 60° C., yielding Comparative Polymer 2.

The weight-average molecular weight (Mw) was obtained by gel permeation chromatography (GPC) using a polystyrene standard, and with $^{13}$C-NMR the copolymerization ratio was found to be the following.

Reference Polymer 2

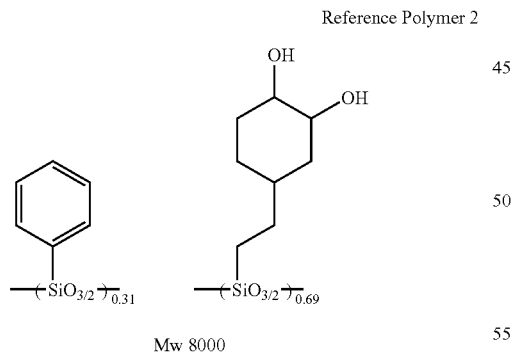

Mw 8000

EXAMPLES AND COMPARATIVE EXAMPLES

<Preparation of the Antireflective Film Material>

The polymers obtained in Synthesis Examples 1 to 7 and Comparative Synthesis Example 1 were dissolved in an organic solvent including 0.1 wt % FC-430 (made by Sumitomo 3M) at the proportions shown in Table 1 and the result was filtered by a 0.1 μm filter made of fluorine resin, preparing antireflective film materials (Examples 1 to 8 and Comparative Example 1).

The various compositions in Table 1 are as follows:

Polymers 1 to 7: obtained through Synthesis Examples 1 to 7

Reference Polymer 1: obtained through Comparative Synthesis Example 1

Crosslinking Agent: CR1, CR2, OH-Additive 1 (see structural formula below)

Reference Polymer 2: obtained through Comparative Synthesis Example 2

Acid Generator: AG1, AG2 (see structural formula below)

Organic Solvent: PGMEA (propylene glycol monomethyl ether acetate)

CR-1

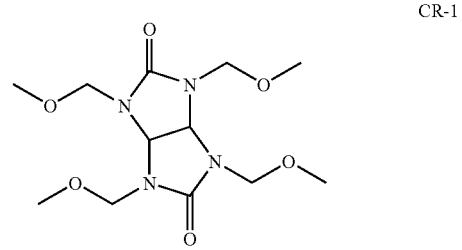

CR-2

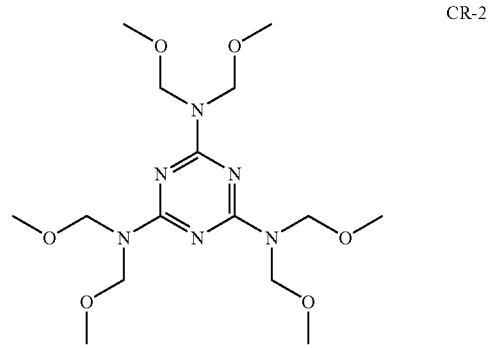

OH-Additive 1

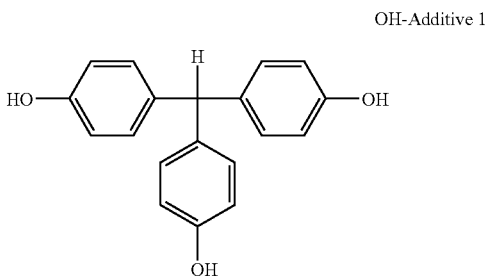

AG 1

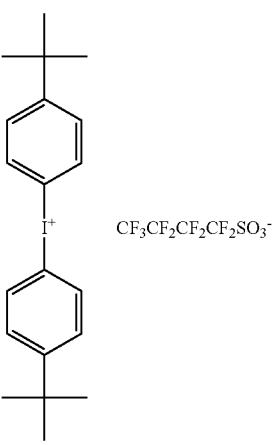

$CF_3CF_2CF_2CF_2SO_3^-$

-continued

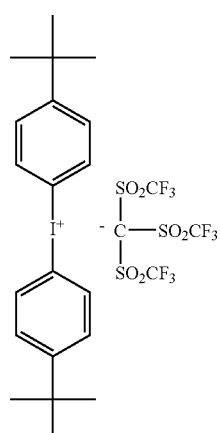

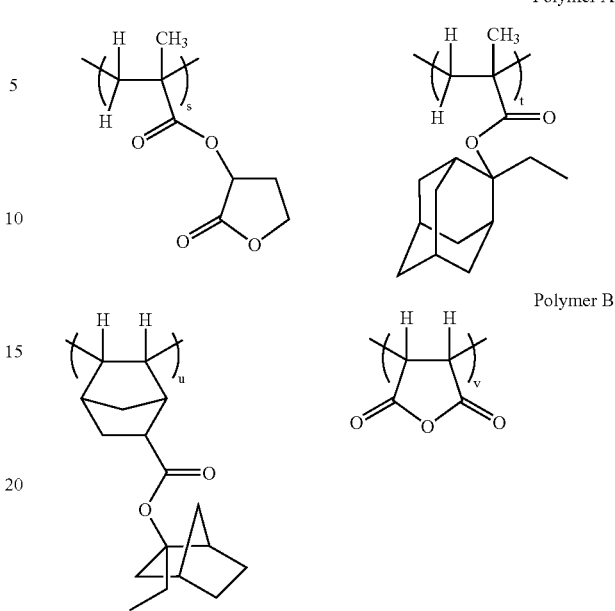

The antireflective film materials prepared in this manner were applied onto silicon substrates and baked at 200° C. for 120 seconds to form antireflective films 193 nm thick.

After the antireflective films were formed, the refractive indices (n, k) of the antireflective films at a wavelength of 193 nm were found with a variable incidence angle spectroscopic ellipsometer (VASE) by J.A. Woollam Co., Inc., and the results are shown in Table 1.

TABLE 1

| | Polymer | Crosslink-ing Agent | Acid Generator | Organic Solvent | Refractive Index at 193 nm | | Film Thickness | Thickness of Film formed 3 Months Later |
|---|---|---|---|---|---|---|---|---|
| | (wt pts) | (wt pts) | (wt pts) | (wt pts) | N | k | (Å) | (Å) |
| Ex 1 | Polymer 1 (4.0) | CR1 (10) | AG1 (4) | PGMEA (100) | 1.80 | 0.20 | 1982 | 1997 |
| Ex 2 | Polymer 2 (4.0) | CR1 (10) | AG1 (4) | PGMEA (100) | 1.81 | 0.21 | 1951 | 1957 |
| Ex 3 | Polymer 3 (4.0) | — | AG1 (2) | PGMEA (100) | 1.77 | 0.28 | 1980 | 1988 |
| Ex 4 | Polymer 3 (4.0) | OH-Additive (5) | AG1 (2) | PGMEA (100) | 1.76 | 0.32 | 1994 | 1997 |
| Ex 5 | Polymer 4 (4.0) | CR1 (10) | AG1 (4) | PGMEA (100) | 1.76 | 0.25 | 1965 | 1973 |
| Ex 6 | Polymer 5 (4.0) | CR1 (10) | AG1 (4) | PGMEA (100) | 1.77 | 0.18 | 1966 | 1979 |
| Ex 7 | Polymer 1 (2.0) Polymer 6 (2.0) | CR1 (10) | AG1 (4) | PGMEA (100) | 1.78 | 0.30 | 2045 | 2061 |
| Ex 8 | Polymer 2 (4.0) | CR1 (10) | AG2 (4) | PGMEA (100) | 1.77 | 0.28 | 1990 | 2008 |
| Comp Ex 1 | Comp. Poly. 1 (4.0) | CR1 (10) | AG1 (4) | PGMEA (100) | 1.63 | 0.30 | 1950 | 1955 |
| Comp Ex 2 | Comp. Poly. 2 (4.0) | CR1 (10) | AG1 (4) | PGMEA (100) | 1.68 | 0.21 | 1985 | 1998 |

As shown in Table 1, the antireflective films of Working Examples 1 to 8 and Reference Example 1 have a refractive index n value within the range of 1.5 to 1.9 and a k value greater than 0.15. It is clear that these antireflective films have ideal n and k values for attaining a sufficient antireflective effect. Moreover, it is clear that there was hardly any change in film thickness even after the storage at room temperature for three months.

<Preparation of the Photoresist Film Material>
The following polymers (Polymer A to Polymer C) were prepared as the base resin of the photoresist film material.

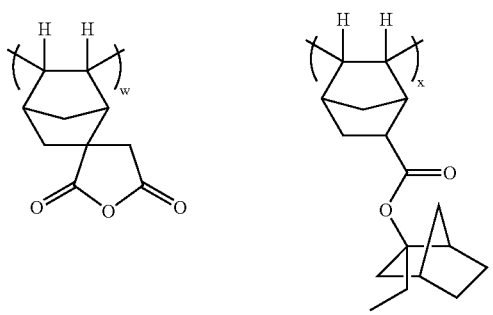

Polymer A is made of the repeating units s and t shown above. The copolymerization ratio and the weight average molecular weight (Mw) of this polymer are shown below.
Copolymerization ratio s:t=0.40:0.60
Weight-average molecular weight (Mw)=8800
Polymer B is made of the repeating units u and v shown above. The copolymerization ratio and the weight-average molecular weight (Mw) of this polymer are shown below.
Copolymer mole ratio u:v=0.50:0.50
Weight-average molecular weight (Mw)=8300
Polymer C is made of the repeating units w and x shown above. The copolymerization ratio and the weight-average molecular weight (Mw) of this polymer are shown below.
Copolymer mole ratio w:x=0.40:0.60
Weight-average molecular weight (Mw)=18300

Using the polymers prepared above (Polymer A to Polymer C), photoresist film materials 1 to 3 for ArF lithography were prepared at the compositions shown in Table 2. The compositions in Table 2 are as follows.
Polymer: Polymer A to Polymer C
Acid Generator: PAG1 (see following structural formula)
Base Additive: Triethanolamine
Organic Solvent: PGMEA (propylene glycol monomethyl ether acetate)

TABLE 2

PAG1

$\text{(C}_6\text{H}_5\text{)}_3\text{S}^+ \ \text{CF}_3\text{CF}_2\text{CF}_2\text{CF}_2\text{SO}_3^-$

| | Polymer (wt pts) | Acid Generator (wt pts) | Base Additive (wt pts) | Organic Solvent (wt pts) |
|---|---|---|---|---|
| Photoresist Film Material 1 | Polymer A (100) | PAG1 (2.0) | Triethanol amine (0.2) | PGMEA (6000) |
| Photoresist Film Material 2 | Polymer B (100) | PAG1 (2.0) | Triethanol amine (0.2) | PGMEA (6000) |
| Photoresist Film Material 3 | Polymer C (100) | PAG1 (2.0) | Triethanol amine (0.2) | PGMEA (6000) |

<Observing the Pattern Shape and Etching Resistance Test>

(1) Observing the Pattern Shape

The antireflective film materials prepared above (Examples 1 to 8, Comparative Example 1) were applied onto silicon substrates and baked at 200° C. for 120 seconds, forming antireflective films 193 nm thick.

Next, the photoresist film materials 1 to 3 prepared above were applied to the antireflective films at the combinations shown in Table 3 and baked at 120° C. for 60 seconds to prepare photoresist films 250 nm thick.

Next, the photoresist films were exposed with an ArF exposure device (made by Nikon; S305B, NA 0.68, δ 0.85, ⅔ cycle illumination, Cr mask), baked at 110° C. for 90 seconds (PEB), and developed with a 2.38 wt % tetramethylammonium hydroxide (TMAH) aqueous solution, yielding 0.13 μm line-and-space positive resist patterns. As regards the shape of the resist patterns thus obtained (cross-sectional shape of the photoresist films), whether or not tailing, undercutting, or intermixing had occurred was observed, and the results of this observation are shown in Table 3.

TABLE 3

| Antireflective Film Material | Photoresist Film Material | 130 nm line-and-space Resist Pattern Shape |
|---|---|---|
| Ex 1 | photoresist film material 1 | vertical, no tail |
| Ex 2 | photoresist film material 1 | vertical, no tail |
| Ex 3 | photoresist film material 1 | vertical, no tail |
| Ex 4 | photoresist film material 1 | vertical, no tail |
| Ex 5 | photoresist film material 1 | vertical, no tail |
| Ex 6 | photoresist film material 1 | vertical, no tail |
| Ex 7 | photoresist film material 1 | vertical, no tail |
| Ex 8 | photoresist film material 1 | vertical, no tail |
| Ex 1 | photoresist film material 2 | vertical, no tail |
| Ex 1 | photoresist film material 3 | vertical, no tail |
| Comp. Ex 1 | photoresist film material 1 | slight reverse tapering, tailing |
| Comp. Ex 2 | photoresist film material 2 | pattern toppled due to reverse tapering |

From the results it is clear that if the antireflective film materials of Examples 1 to 8 are used, then tailing, undercutting, or intermixing do not occur near the border between the photoresist film and the antireflective film, and it was confirmed that rectangular patterns were achieved. However, slight reverse tapering and tailing were observed when the antireflective film material of Comparative Example 1 was used.

(2) Etching Resistance Test

The etching resistance of the antireflective films formed from the above antireflective film materials (Examples 1 to 8, Comparative Example 1) and the photoresist films formed from the above photoresist film materials (photoresist film materials 1 to 3) was evaluated under the following two groups of conditions.

(i) Etching Test with $CHF_3/CF_4$ Gases

The differences in film thickness of the antireflective film, the photoresist film, and the $SiO_2$ film before and after etching were measured using the dry-etching device TE-8500P made by Tokyo Electron.

The etching conditions were as follows.

| | |
|---|---|
| Chamber Pressure | 40 Pa |
| RF Power | 1,300 W |
| Gap | 9 mm |
| $CHF_3$ Gas Flow Amount | 30 ml/min |
| $CF_4$ Gas Flow Amount | 30 ml/min |
| Ar Gas Flow Amount | 100 ml/min |
| Time | 10 sec |

The results are tabulated in Table 4.

TABLE 4

| Film Material etc. | CHF$_3$/CF$_4$ Based Gas Etching (nm/min) |
|---|---|
| Ex 1 | 260 |
| Ex 2 | 288 |
| Ex 3 | 222 |
| Ex 4 | 264 |
| Ex 5 | 281 |
| Ex 6 | 279 |
| Ex 7 | 270 |
| Ex 8 | 269 |
| Comp. Ex 1 | 241 |
| Comp. Ex 2 | 260 |
| Photoresist Film Material 1 | 142 |
| Photoresist Film Material 2 | 125 |
| Photoresist Film Material 3 | 112 |
| SiO$_2$ | 450 |

As shown in Table 4, the antireflective films formed from the antireflective film materials of the present invention (Examples 1 to 8) exhibited a dry etching speed with CHF$_3$/CF$_4$ gases that was sufficiently faster than that of the photoresist film and sufficiently slower than that of the SiO$_2$ film. Thus, if a SiO$_2$ film is the layer that is to be processed of the substrate, then the antireflective films sufficiently function as hard masks during substrate etching.

(ii) Etching Test with Cl$_2$/BCl$_3$ Gases

The differences in film thickness of the antireflective film and the p-Si before and after etching were found using the dry-etching device L-507D-L made by ANELVA Corporation.

The etching conditions were as follows.

| | |
|---|---|
| Chamber Pressure | 40.0 Pa |
| RF Power | 300 W |
| Gap | 9 mm |
| Cl$_2$ Gas Flow Amount | 30 ml/min |
| BCl$_3$ Gas Flow Amount | 30 ml/min |
| CHF$_3$ Gas Flow Amount | 100 ml/min |
| O$_2$ Gas Flow Amount | 2 ml/min |
| Time | 60 sec |

The results are tabulated in Table 5.

TABLE 5

| Film Material etc. | Cl$_s$/BCl$_3$ Based Gas Etching (nm/min) |
|---|---|
| Ex 1 | 116 |
| Ex 2 | 119 |
| Ex 3 | 121 |
| Ex 4 | 120 |
| Ex 5 | 116 |
| Ex 6 | 122 |
| Ex 7 | 127 |
| Ex 8 | 117 |
| Ex 1 | 129 |
| Ex 2 | 123 |
| p-Si | 300 |

As shown in Table 5, the antireflective films formed from the antireflective film materials of the present invention (Examples 1 to 8) exhibited a dry etching speed with Cl$_2$/BCl$_3$ gases that was sufficiently slower than that of p-Si. Thus, if p-Si is the layer that is to be processed of the substrate, then the antireflective films demonstrate sufficient performance as hard masks.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

The invention claimed is:

1. An antireflective film material, comprising:
a polymer comprising copolymerized repeating units of mole fractions p and 1-p expressed by Formula (1):

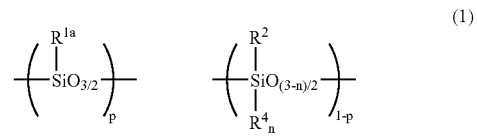

wherein p is a number in the range of 0<p<1; $R^{1a}$ is a monovalent organic group which is capable of crosslinking, such that the repeating unit that corresponds to mole fraction p is selected from any one of the group consisting of the following:

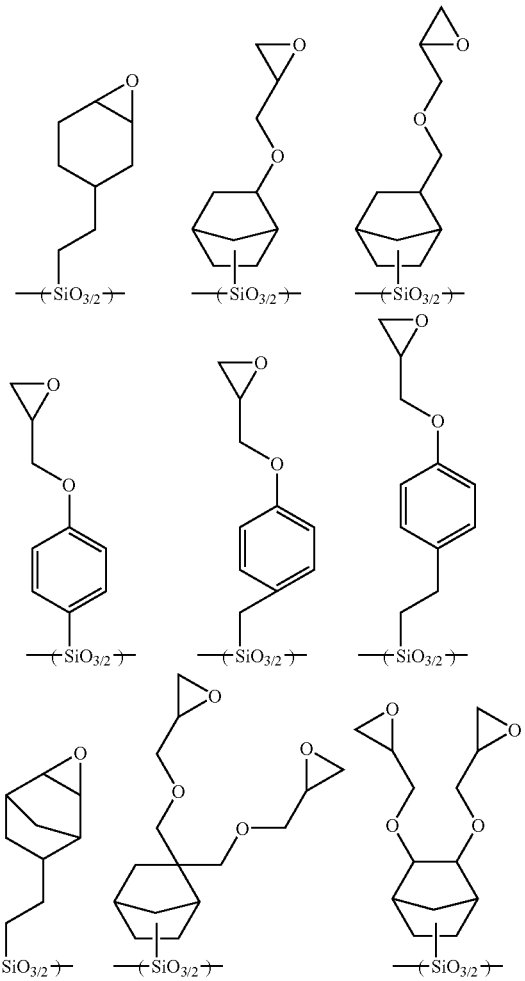

-continued

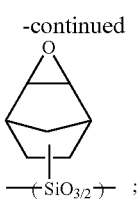

$R^2$ is a monovalent organic group containing a light-absorbing group; $R^4$ is a monovalent organic group which is capable of crosslinking, a hydroxyl group, an alkyl group having 1 to 6 carbon atoms, an alkoxy group having 1 to 4 carbon atoms, or a monovalent organic group containing a light-absorbing group; and n is a number in the range $0 \leq n \leq 1$;

an organic solvent;

an acid generator; and a crosslinking agent.

2. The antireflective film material according to claim 1 wherein said light-absorbing group of $R^2$ in Formula (1) comprises an anthracene ring, a naphthalene ring, or a benzene ring.

3. An antireflective film obtainable by applying said antireflective film material according claim 1 onto a substrate and baking the antireflective film material.

4. The antireflective film material according to claim 1, wherein said crosslinking agent is an agent for crosslinking with the polymer of Formula (I) in the presence of an acid.

5. The antireflective film material according to claim 1, wherein said crosslinking agent is selected from the group consisting of:

a) melamine compounds;
b) guanamine compounds;
c) glycoluril compounds,
d) urea compounds;
e) epoxy compounds;
f) thioepoxy compounds;
g) isocyanate compounds;
h) azide compounds; and
i) compounds comprising a double bond, in which there has been a substitution on said crosslinking agent by at least one group selected from the group consisting of methylol; alkoxymethyl; and acyloxymethyl.

* * * * *